United States Patent
Hébert

(10) Patent No.: US 7,867,852 B2
(45) Date of Patent: Jan. 11, 2011

(54) SUPER-SELF-ALIGNED TRENCH-DMOS STRUCTURE AND METHOD

(75) Inventor: François Hébert, San Mateo, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 149 days.

(21) Appl. No.: 12/189,062

(22) Filed: Aug. 8, 2008

(65) Prior Publication Data

US 2010/0032751 A1 Feb. 11, 2010

(51) Int. Cl.
*H01L 21/336* (2006.01)
(52) U.S. Cl. ............................... 438/270; 257/E21.418
(58) Field of Classification Search ......... 438/268–270, 438/589; 257/E21.41, E21.418, E21.419
See application file for complete search history.

(56) References Cited

U.S. PATENT DOCUMENTS

| | | | |
|---|---|---|---|
| 5,378,655 A * | 1/1995 | Hutchings et al. | 438/138 |
| 5,567,634 A | 10/1996 | Hebert et al. | |
| 5,665,619 A | 9/1997 | Kwan et al. | |
| 5,684,319 A | 11/1997 | Hebert | |
| 6,924,198 B2 | 8/2005 | Williams et al. | |
| 7,323,386 B2 * | 1/2008 | Yilmaz | 438/268 |
| 2006/0071268 A1 | 4/2006 | Tai et al. | |

OTHER PUBLICATIONS

U.S. Appl. No. 12/958,162, entitled "Super-Self-Aligned Trench-DMOS Structure and Method", filed Dec. 1, 2010.

* cited by examiner

*Primary Examiner*—Quoc D Hoang
(74) *Attorney, Agent, or Firm*—Joshua D. Isenberg; JDI Patent

(57) ABSTRACT

A semiconductor device includes a P-body layer formed in an N-epitaxial layer; a gate electrode formed in a trench in the P-body and N-epitaxial layer; a top source region formed from the P-body layer next to the gate electrode; a gate insulator disposed along a sidewall of the gate electrode between the gate electrode and the source, between the gate electrode and the P-body and between the gate electrode and the N-epitaxial layer; a cap insulator disposed on top of the gate electrode; and an N+ doped spacer disposed along a sidewall of the source and a sidewall of the gate insulator. The source includes N+ dopants diffused from the spacer. A body contact region containing P-type dopants is formed from the N-epitaxial layer. The contact region touches one or more P-doped regions of the P-body layer and the source. Methods for manufacturing such a device are also disclosed. Embodiments of this invention may also be applied to P-channel devices.

13 Claims, 21 Drawing Sheets

SUPER-SELF-ALIGNED TRENCH-DMOS STRUCTURE AND METHOD

FIELD OF THE INVENTION

This invention generally relates to vertical power MOSFET devices and more particularly to power MOSFET devices having improved source and body contact structure for highest-performance.

BACKGROUND OF THE INVENTION

Conventionally, a trench double diffused metal oxide silicon (Trench-DMOS) transistor is used to provide high power transistors for power integrated circuit applications. Various internal parasitic effects often impose design and performance limitations on conventional Trench-DMOS transistors. Conventional trench-gate DMOS with polysilicon gate equal to, below (Recessed-Gate Trench-DMOS) and above the silicon surface (PSU Poly-Stick-Up, or Stick-up poly gate, SUPG) requires a mask to either block the source N+ implant from the body contact region or form a "trench-contact" through which the exposed N+ Silicon may be etched to allow for a P+ implant to contact the body region of the DMOS transistor. Furthermore, standard trench-gate D-MOSFETs (or DMOS), with or without PSU (stick-up-poly or Poly-Stick-Up), require an alignment to form the Source contact, which can influence yield if there are misalignments or if the critical dimension (CD) control of the contact or other layers is not adequate (e.g., yield loss in the form of $I_{gss}$ gate-source leakage). A larger cell pitch would be required to accommodate the extra contact to gate alignment (and or CD control tolerances) which is undesirable since this would result in a power transistor with a larger on-resistance and a reduced efficiency. In addition, it is difficult to implement self-aligned contact.

U.S. Pat. No. 5,567,634 discloses metal oxide semiconductor (MOS) devices and a method of fabricating trench, double diffused MOS (DMOS) transistors with the contact to the transistor's source and body self-aligned to the trench. The self-aligned contact reduces the distance between trench edges with a resulting increase in packing density and current driving capability and decrease in on-resistance.

U.S. Pat. No. 5,684,319 discloses a DMOS device structure, and method of manufacturing the same features a self-aligned source and body contact structure which requires no additional masks. N+ polysilicon spacers are used to form the source region at the periphery of the gate polysilicon. However, the N+ polysilicon source only improves the source contact, which lowers the resistance, but it has no effect on body region. U.S. Pat. No. 5,665,619 disclose a trench DMOS transistor structure includes a contact to the transistor's source and body that is self-aligned to the trench and methods of fabricating the self-aligned contact structure. The methods rely on an oxide/nitride/oxide (ONO) stack on the active layer, and the use of an oxide etchback to protect the top of the Poly gate after poly gate etch back. Spacers are then used to protect the sidewalls. In addition, in these methods, an ONO stack may be used to protect the active region, and after the poly etch back, a thermal oxide is grown on the top of the poly gate.

U.S. Pat. No. 5,378,655 discloses a method of manufacturing a semiconductor device including an insulated gate field effect device in which the insulated gate is formed within a groove or recess. In this method, the oxide on top of the polysilicon gate is formed prior to forming the spacers.

U.S. Pat. No. 6,924,198 discloses a trench-gated MOSFET formed using a super self aligned (SSA) process that employs an insulating layer such as a glass layer and a contact mask to define contact openings for electrical connections to source regions of the MOSFET. A contact mask and an intervening glass are used in the otherwise self-aligned process to reduces coupling capacitance between source metal and the top of the embedded trench gate. A metal layer deposited to make electrical contact to source regions can be planarized, for example, ground flat using chemical-mechanical polishing to provide a flat surface to avoid formation of conductive traces that extend over the steps that the glass layer forms. However, a contact is used within the stripe and the body contact is not distributed.

Alpha & Omega Semiconductor of Sunnyvale, Calif., has disclosed trench MOSFETs having poly-stick-up (PSU) gate as shown in FIG. 1. An example of such a gate structure is described, e.g., in U.S. Patent Application Publication No. 20060071268, which is incorporated herein by reference. As shown in the perspective view illustrated in FIG. 1, a power MOSFET device 100 may include a drain 102 formed on a semiconductor substrate, a body 104, a source 106 that is embedded in the body and extends downward from the top surface of the body into the body. The device 100 also includes a gate 108 made of conductive material such as polycrystalline silicon (poly) that is disposed in a trench that extends through the source and the body to the drain. The top surface of the gate 108 extends substantially above the top surface of source 106. By extending the gate through the source, the gate overlaps the bottom of the source even when the source depth changes. A dielectric material layer 110 is disposed over the gate to insulate the gate from source-body contact. Appropriate dielectric material includes thermal oxide, low temperature oxide (LTO), boro-phospho-silicate glass (BPSG), etc. A metal layer (not shown) is disposed on the device to form contact with the source and the gate.

It would be desirable to develop a structure which achieves self-aligned source/body contact without using a mask, as well as a highly rugged and robust structure with low-resistance source and body contact. It would be further desirable to develop a structure which achieves low-thermal budget to realize shallow junctions, compatible with stripe and closed-cell geometries, compatible with standard foundry process, with standard metallization schemes to achieve low contact resistivity, compatible with ultra-small cell-pitch. It would be further desirable to produce a device with a low-cost of manufacture.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1:
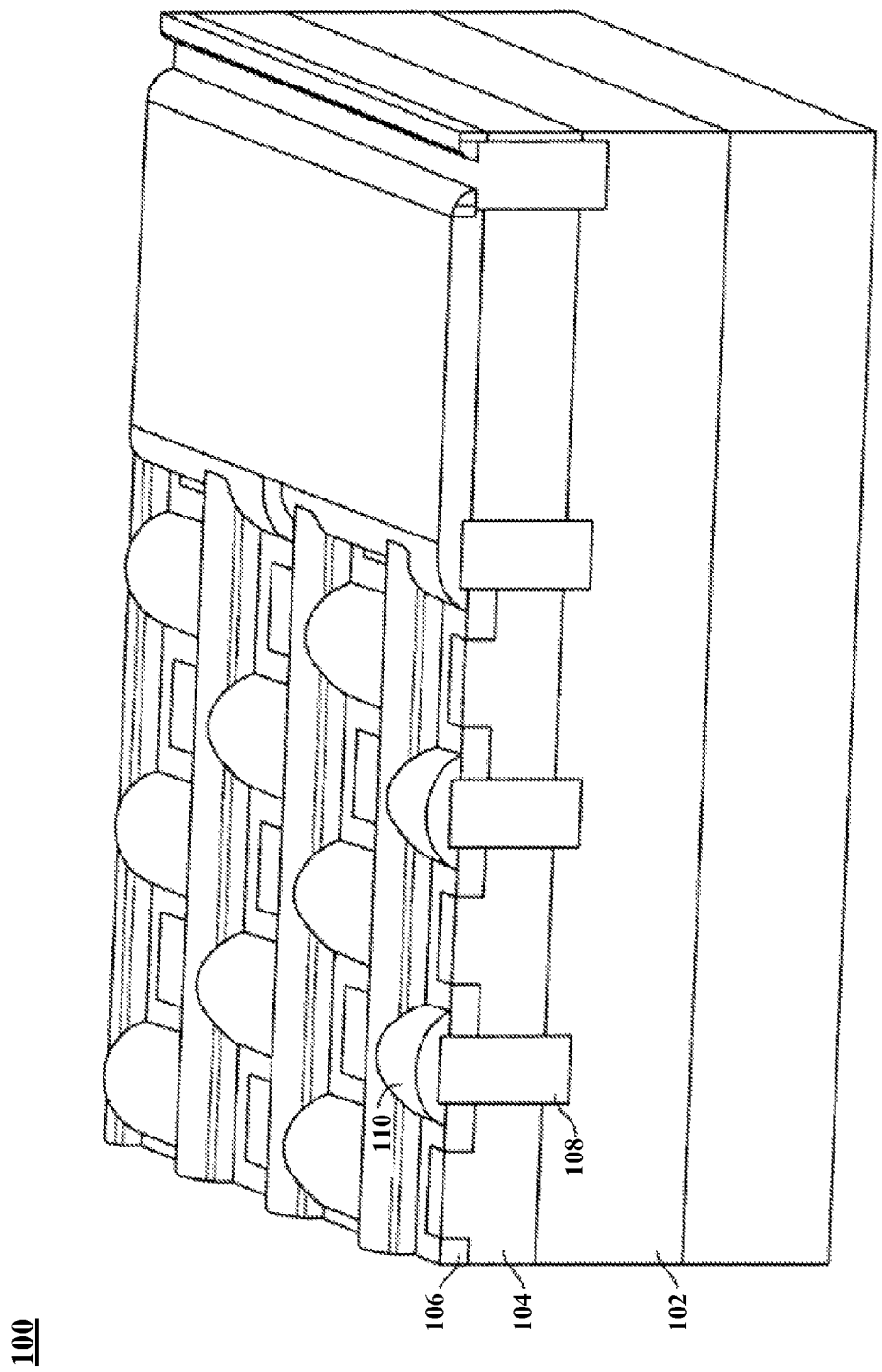
FIG. 1 is a perspective view of a trench MOSFET of the prior art.
Figure 2A:
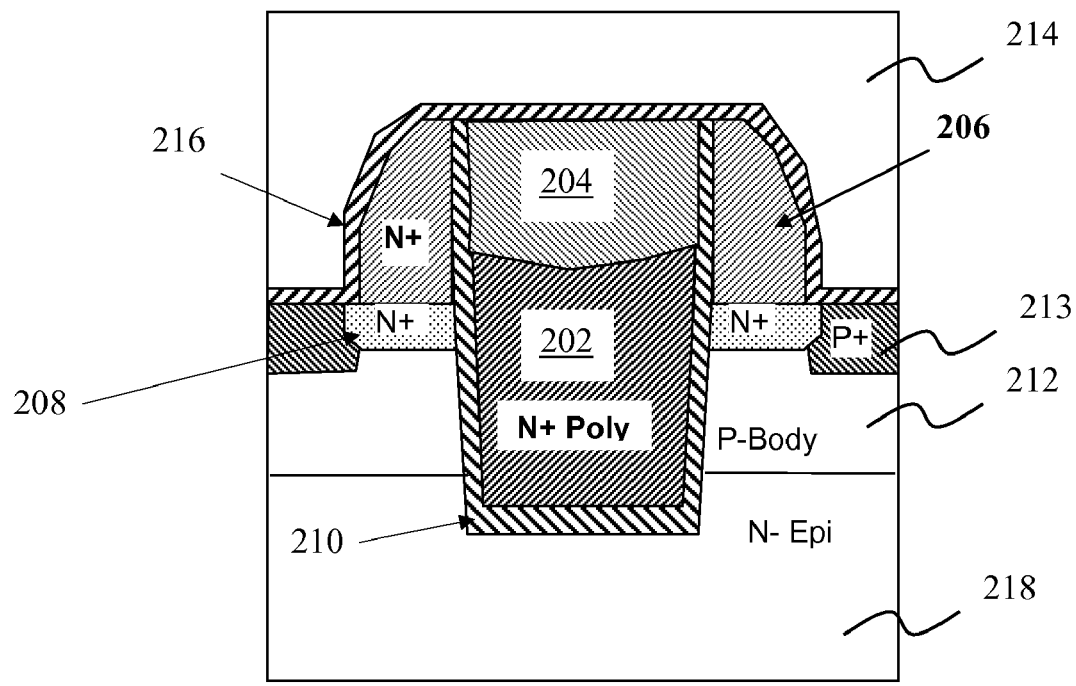
FIG. 2A is a cross-sectional view of a self-aligned trench DMOSFET according to an embodiment of the present invention.

FIG. 2A is a cross-sectional view of a self-aligned vertical trench DMOS 200 according to an embodiment of the present invention. The vertical trench MOSFET 200 includes a P-body layer 212 formed on an N-epitaxial (epi) layer 218, a N+ poly trenched gate 202 formed in a trench in the P-body layer 212 and the N-epi layer 218 grown on top of a highly doped substrate, (not shown), a self-aligned N+ source diffusion region 208 disposed in the P-body layer 212 next to the trenched gate 202. The top surface of the N+ source region 208 and the top surface of the P-body layer 212 are coplanar. The MOSFET device 200 includes an integrated body contact 213 formed in the P-body layer 212, which is self-aligned with the source diffusion edges to minimize the cell dimensions and pitch. The body contact 213 touches both P-doped regions of the P-body layer 212 and the N+ doped source region 208 within the P-body layer.

The trench MOSFET 200 also includes a gate insulator 210, e.g., an oxide, nitride or combination thereof, disposed between the gate 202, the N+ source diffusion region 208, P-body layer 212 and the N-epi layer 218. A cap insulator 204, e.g., an oxide, nitride or combination thereof, is disposed on top of the trenched gate electrode 202. As may be seen in FIG. 2A. The cap insulator 204 does not extend beyond sides of the gate electrode 202. In a preferred embodiment, the cap insulator 204 is made of a nitride material, e.g., silicon nitride. A highly N+ doped spacer 206 is disposed along a sidewall of the trenched gate 202 and a sidewall of the cap insulator 204. In a preferred embodiment, the spacer 206 is made of polysilicon. Dopants from the highly doped N+ doped spacer 206 are diffused into nearby silicon regions (which contact the doped spacer 206) of the P-body layer 212, e.g., by thermal diffusion, to form self-aligned N+ source diffusion region 208. The body contact 213 is also self-aligned to the highly doped N+ spacer 206 and the N+ source diffusion region 208. By way of example, the N+ doped spacer may be made of a conductive material, such as polysilicon doped with N+ type dopants.

The trench MOSFET 200 may further include a barrier metal 216, which is disposed on top of the P-body layer 212, the doped N+ doped spacer 206, and the cap insulator 204, and a reflowed source metal 214 to fill contacts.

The embodiment of a self-aligned trench-DMOS structure 200 depicted in FIG. 2A features a sidewall source with self-aligned source doping and body contact formation along the entire trenches (gate width) of the structure. However, embodiments of the invention are not limited to this particular configuration.

Figure 2B:
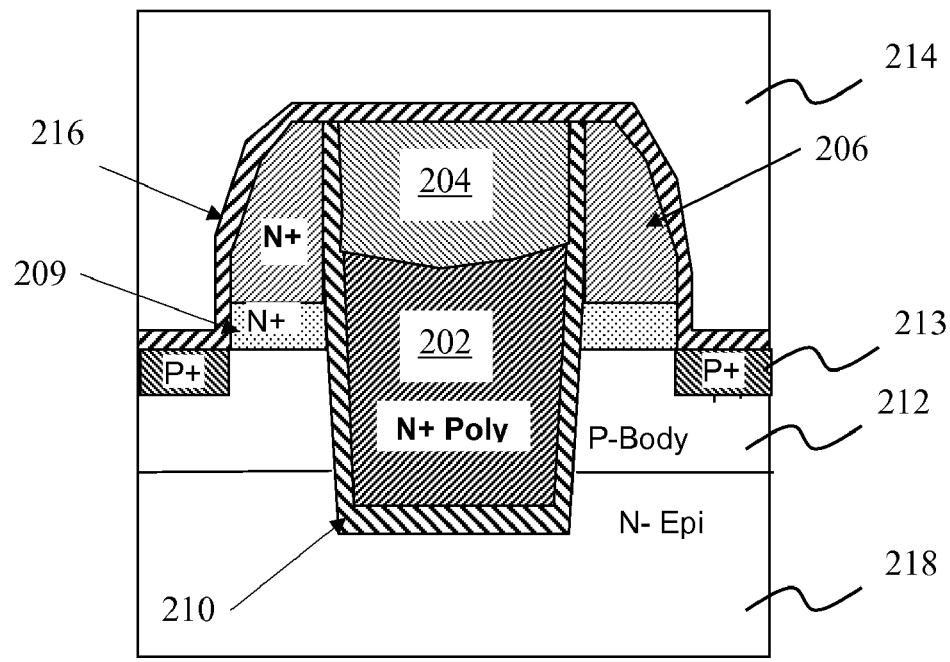
FIG. 2B is a cross-sectional view of an alternative self-aligned trench according to another embodiment of the present invention

FIG. 2B is a cross-sectional of an alternative trench MOSFET 220, which has a similar structure as the trench MOSFET 200. As shown in FIG. 2B, a self-aligned N+ source diffusion region 209 is disposed on the P-body layer 212 such that the bottom surface of the N+ source diffusion region 209 and the top surface of the P-body layer 212 are coplanar. Dopants from the highly doped N+ polysilicon spacer 206 are thermally diffused to form self-aligned N+ source diffusion region 209. The highly doped N+ spacer 206 may be formed using implantation of the polysilicon, or POCl3 diffusion of the polysilicon. Alternatively, the polysilicon may be in-situ doped.

Alternatively, other doped material could be used as a diffusion source for the emitter. Particularly for the embodiment of FIG. 2B, since the metal contacts the sidewalls of the source region 209, the doped spacer may not have to be conductive (although this is clearly preferred since the metal contacts a larger source surface area, which reduces the contact resistance). The material could possibly be a doped dielectric like PSG (phosphorus doped glass).

In the configuration illustrated in FIG. 2B, the body contact region 213 formed from the P-body region 212 may contact the N+ source region 209 at a corner thereof. The size and depth of the area of contact between the source region 209 and the body contact region 213 may be determined by the dimensions of the spacer 206. Such a configuration may improve unclamped inductive switching (UIS) capabilities by using a recessed body contact region, separated from the gate 202 by the width of the self-aligned source region 209 to ensure low $R_{dson}$. In this embodiment, the body contact region is closer to the channel region (the P-body 212 region adjacent to the gate 202), which is desirable.

Figure 2C:
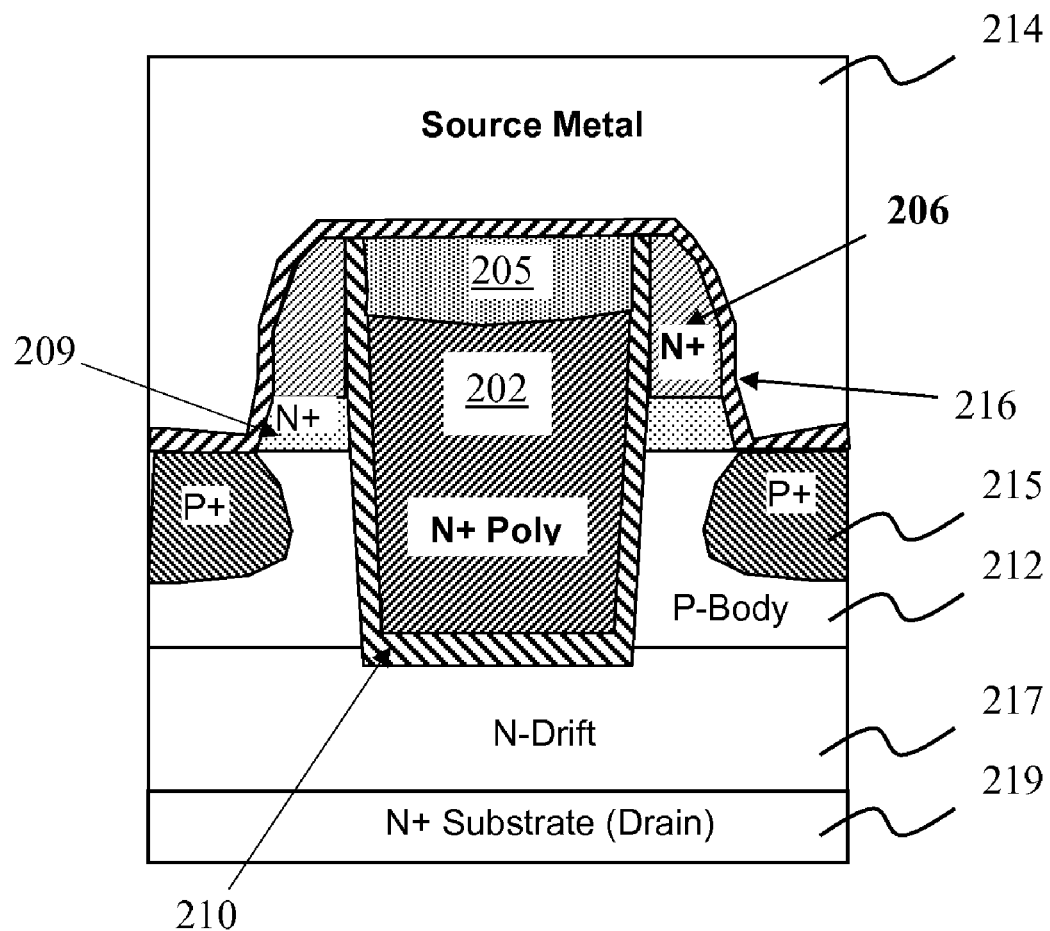
FIG. 2C is a cross-sectional view of an alternative self-aligned trench according to another embodiment of the present invention

FIG. 2C is a cross-sectional of an alternative trench MOSFET 230 according to an alternative embodiment of the present invention. The trench MOSFET 230 includes a P-body layer 212 formed on an N-drift layer 217, which is formed on a N+ substrate 219 that acts as a drain, and a N+ poly trenched gate 202 formed in a trench in the P-body layer 212. As shown in FIG. 2C, a self-aligned N+ source diffusion region 209 is disposed on the P-body layer 212 such that the bottom surface of the N+ source diffusion region 209 and the top surface of the P-body layer 212 are coplanar. Dopants from the highly doped N+ polysilicon spacer 206 are thermally diffused to form self-aligned N+ source diffusion region 209. The highly doped N+ spacer 206 may be formed using implantation of the polysilicon, or POCl$_3$ diffusion of the polysilicon. Alternatively, the spacer material may be in-situ doped.

The trench MOSFET 230 also includes a gate insulator 210, e.g., an oxide, nitride or combination thereof, disposed between the gate 202, the N+ source diffusion region 209, P-body layer 212 and the N-drift layer 217. In this embodiment, a Nitride cap insulator 205, e.g., made of silicon nitride, is disposed on top of the trenched gate electrode 202. As may be seen in FIG. 2C, the cap insulator 205 does not extend beyond sides of the gate electrode 202.

The trench MOSFET 230 may further include a barrier metal 216, which is disposed on top of the P-body layer 212, the doped N+ doped spacer 206, and the nitride cap insulator 205, and a reflowed source metal 214 to fill contacts.

In the configuration illustrated in FIG. 2C, the body contact region 215 formed from the P-body region 212 may contact the N+ source region 209 at a corner thereof. The size and depth of the area of contact between the source region 209 and the body contact region 215 may be determined by the dimensions of the spacer 206. Such a configuration may improve unclamped inductive switching (UIS) capabilities by using a recessed body contact region, separated from the gate 202 by a self-aligned source region 209 to ensure low $R_{dson}$.

Figure 3A:
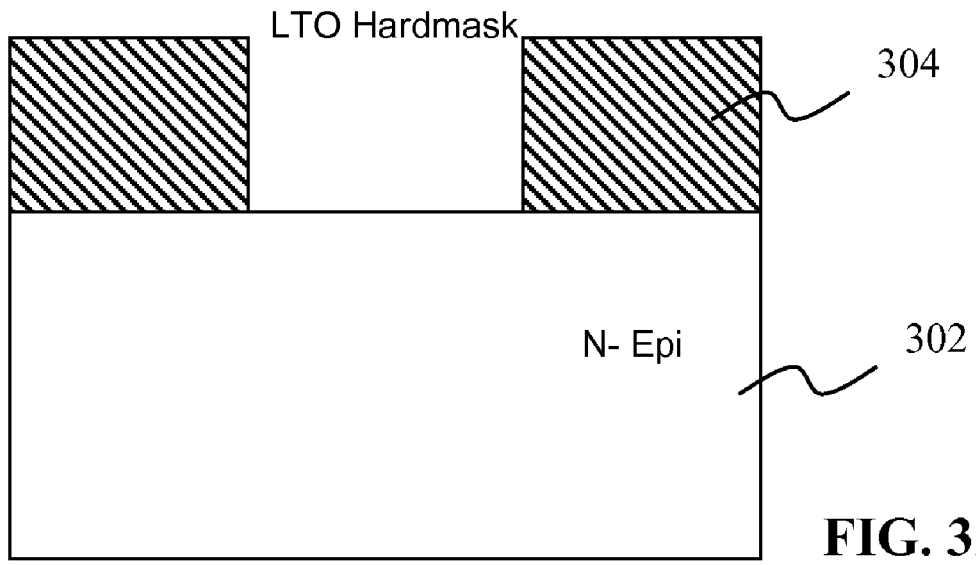
FIGS. 3A-3M are cross-sectional views illustrating a method for manufacturing the MOSFETs of the types depicted in FIG. 2A.

There are a number of different techniques for fabricating MOSFET devices of the types described above. By way of example, FIGS. 3A-3M are cross-sectional views illustrating a method of fabrication of trench MOSFET of the type depicted in FIG. 2A. As shown in FIG. 3A, an N-type epitaxial semiconductor layer 302 may be grown on a substrate which is not shown, (typically highly doped N+ for an N-channel device). A first mask 304, sometimes referred to herein as a trench mask, is then formed on a surface of the N-epi layer 302, e.g., by patterning a photoresist layer, or by patterning a hardmask oxide formed using a low temperature oxide (LTO) deposition technique or thermal oxidation, etched by a photoresist mask.

Figure 3B:
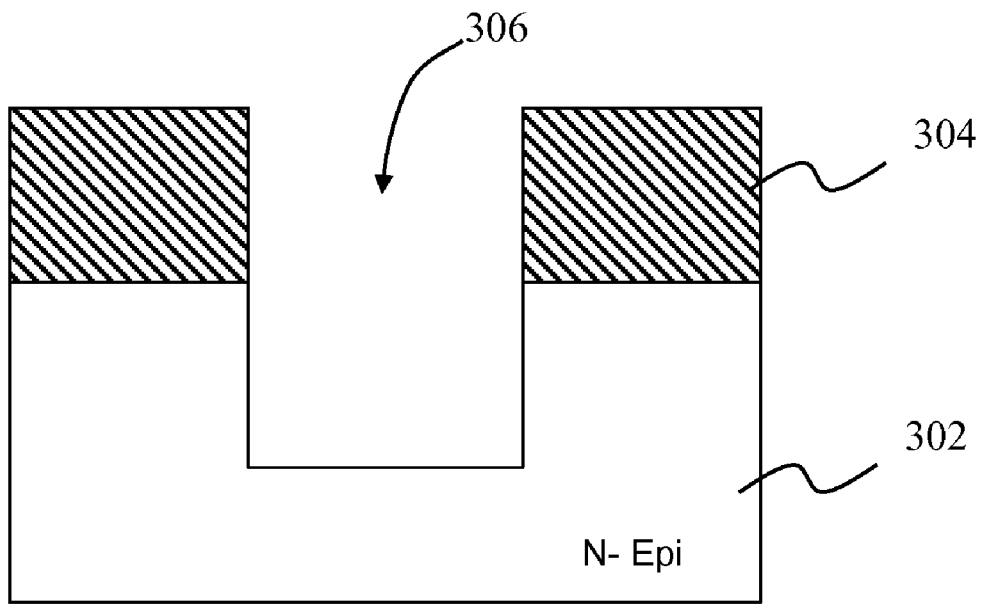
Figure 3C:
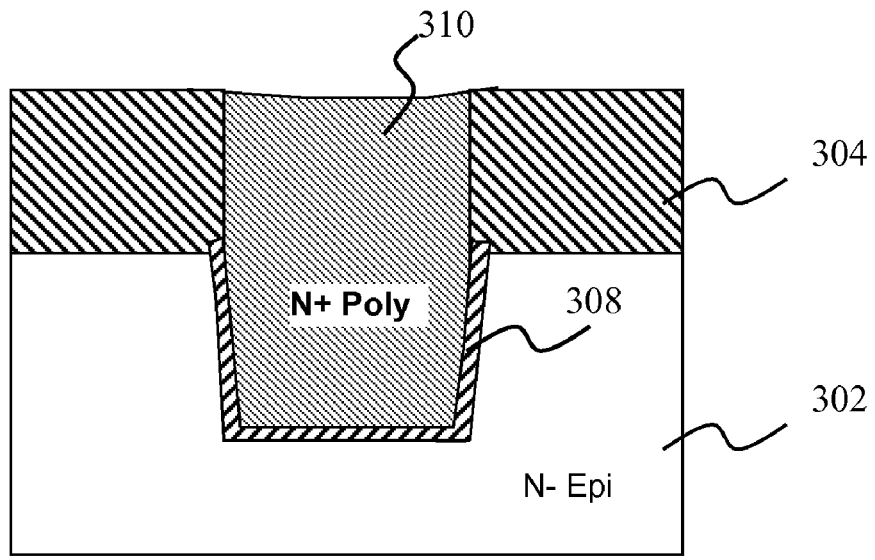
Figure 3D:
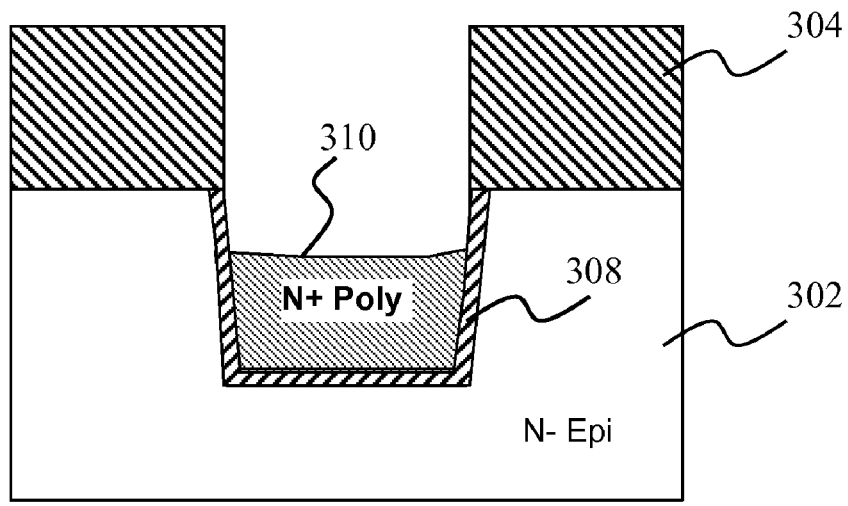

As shown in FIG. 3B, a trench 306 is then formed by etching, e.g., reactive ion etching (RIE), the N-epi silicon layer through the trench mask 304 to a predetermined depth. Etched polymer may then be stripped and wafer cleaned at this point. As shown in FIG. 3C, a thin gate insulator 308, e.g., an oxide, is formed on the sidewall and bottom of the trench 306, e.g., using thermal oxidation, following a standard sacrificial oxide growth and etch procedure. A gate electrode material, such as N+ doped polysilicon, is deposited into the remaining space in the trench 306 to form a trenched gate 310. The conductive material of the trenched gate 310 in the trench 306 is then further etched back to a level below the top surface of the N-epi layer 302 as shown in FIG. 3D.

Figure 3E:
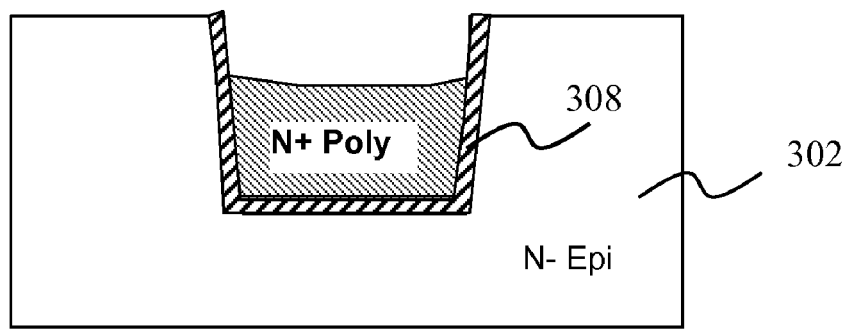
Figure 3F:
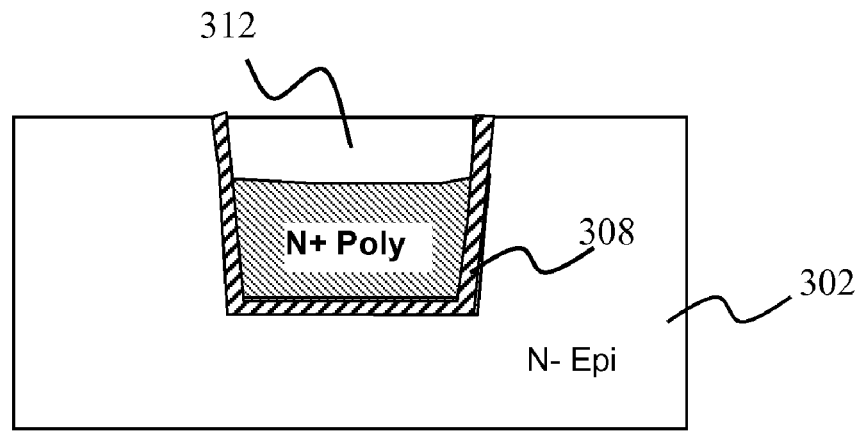

As shown in FIG. 3E, the trench mask 304 is stripped away. A cap insulator 312, e.g., an oxide, nitride or combination thereof, is formed on top of the trenched gate 310 as shown in FIG. 3F. The cap insulator 312 may be planarized with the top of the N-epi layer 302, e.g., using chemical-mechanical planarization (CMP) or etchback. The cap insulator 312 does not extend beyond sides of the trenched gate 310.

Figure 3G:
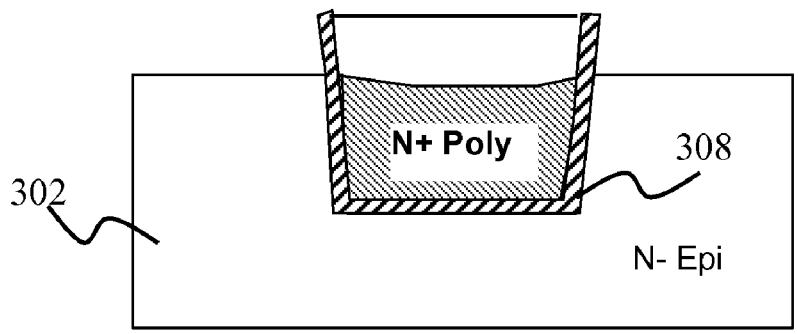
Figure 3H:
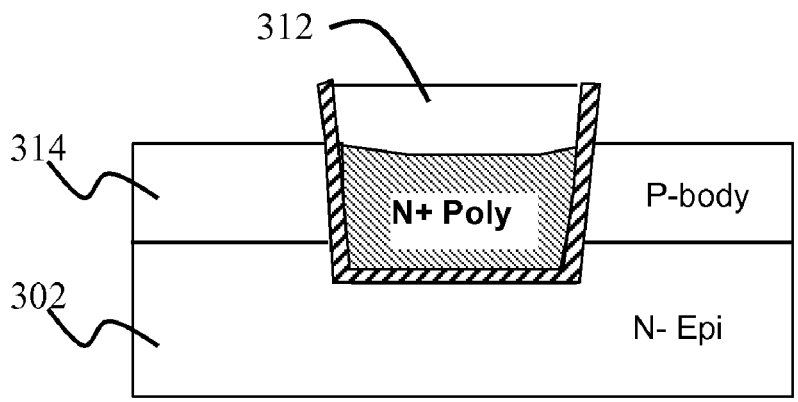

The N-type epitaxial semiconductor layer 302 is selectively etched back to a level same as or below the top surface of the trenched gate 310 as shown in FIG. 3G. A body region 314 is formed by ion implantation and diffusion in the top portion of the N-epi layer 302 as shown in FIG. 3H. By way of example, and not by way of limitation, Boron ions may be implanted into the N-epi layer at an energy of 20 to 100K eV, and a dose of $3\times10^{12}$ to $1\times10^{14}$ to form the P-body region of an N-channel device, for example. A mask may be used for the formation of the termination region (not shown). The ions may then be and diffused, e.g., by heating at 950° C. to 1100° C. Alternatively the body region 314 could be formed before forming the trench mask 304 in FIG. 3A.

Figure 3I:
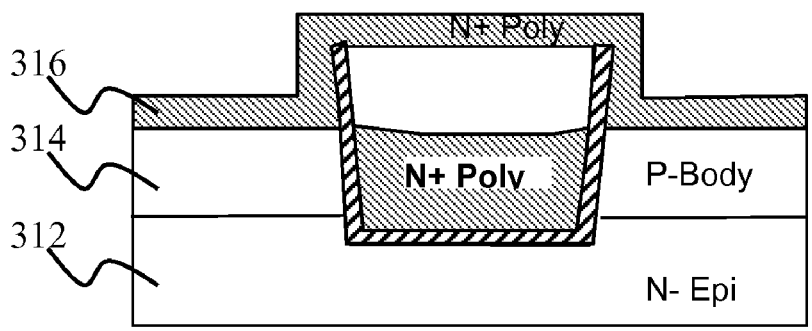
Figure 3J:
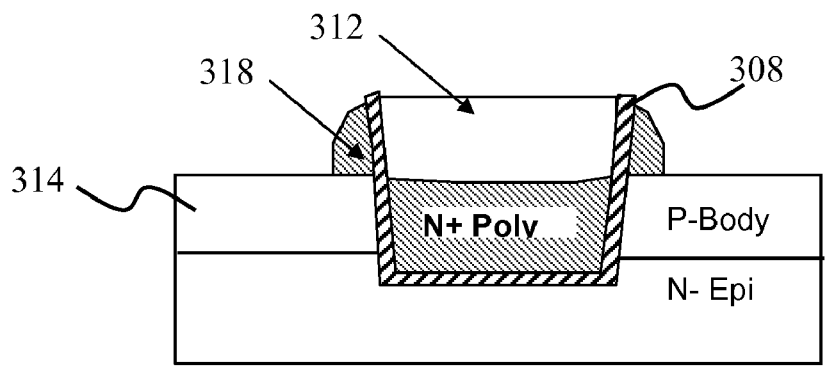

Then, a highly doped N+ polysilicon layer 316, having a thickness about 500 Å to 2K Å, is deposited on a top of the P-Body region 314 and the cap layer 312 as shown in FIG. 3I. The polysilicon layer 316 can be in-situ doped N-type during deposition, or ion-implanted after deposition using either Arsenic or Phosphorus (e.g., at a dose of $1\times10^{15}$ to $5\times10^{15}$, energy 20K eV to 60K eV), if the Polysilicon layer was deposited undoped. The N+ polysilicon layer 316 is then anisotropically etched back, using an etch process that is selective with respect to the material of the cap insulator 312, until the N+ polysilicon is clear from flat surfaces to form a highly doped N+ polysilicon spacer 318 primarily disposed proximate the gate oxide 308 on the sidewalls of the cap layer 312 as shown in FIG. 3J. The polysilicon spacers 318 are self-aligned to the cap layer 312.

Figure 3K:
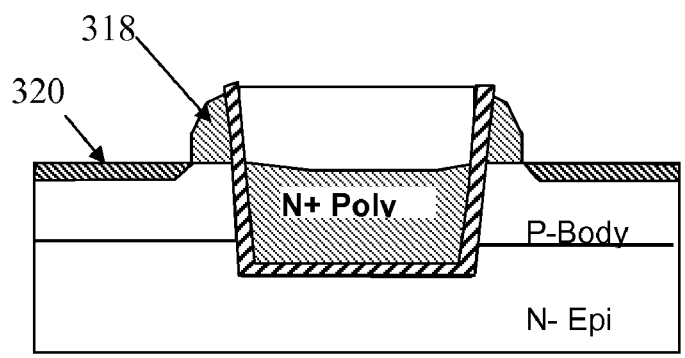

As shown in FIG. 3K, P+ type dopants may be vertically implanted into one or more portions of the top surface of the P-body layer 314 that are not covered by the spacer 318 to form a P+ body contact region 320. The spacer 318 may act as a mask for the implantation of the dopants into the P-body contact region 320. The implant can be a single or a combination of implants with the same conductivity type as the body region, such as boron or BF2, with energies in the 10 to 100K eV range, and doses in the $5\times10^{13}$ to $4\times10^{15}$ range. Because the highly doped N+ spacer 318 is very highly doped, it is not significantly affected by the P+ body contact implantation.

Figure 3L:
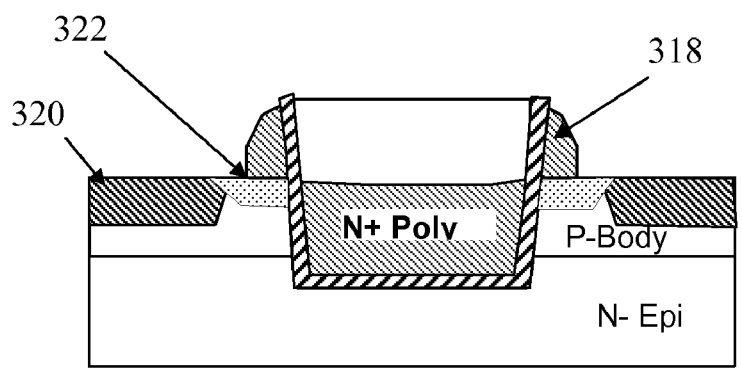

The highly doped N+ spacer 318 (and body contact implant(s)) may then be annealed using Rapid Thermal Process (RTP) of diffusion furnace. The heating diffuses N+ dopants out of the highly doped N+ polysilicion spacer 318 to form an N+ source region 322 in the P-body layer 314 as shown in FIG. 3L. This step may also anneal the P-body contact region 320.

The resulting structure may then be completed by applying a (non-critical dimension) mask to define gate contact regions, by providing vias through the gate cap dielectric 312 (not shown).

Figure 3M:
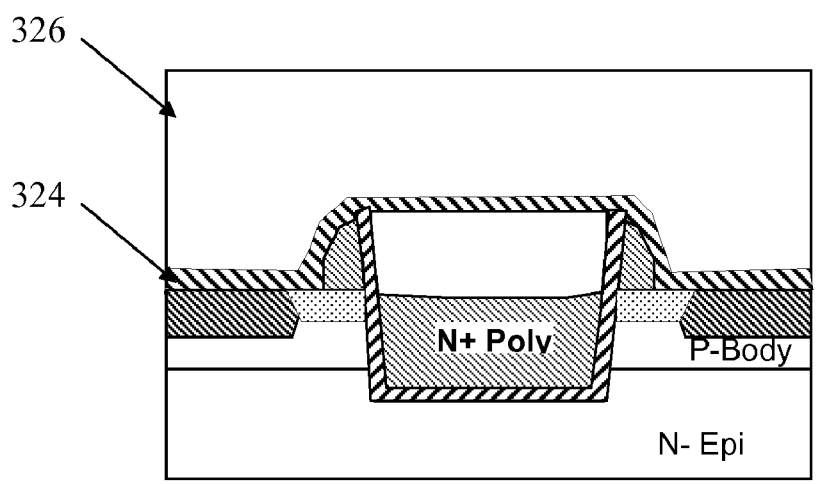

As shown in FIG. 3M, the semiconductor device may be completed by depositing a barrier metal 324 (such as Ti, TiN, Ti/TiN, TiW, TiWN, thickness in the 200 Å to 1500 Å range) on top of the P-body layer 314, the N+ doped polysilicon spacer 318 and the cap insulator 312 followed by the deposition and patterning of a top metal layer (thick aluminum, or AlCu alloy, 0.5 to 4 microns thick for example) 326. The metal may be patterned and etched using a mask which defines the gate and source metal and the locations where the metals can be contacted. The resulting structure may then be passivated, e.g., with a layer of oxide, nitride, or oxynitride, which is not shown in FIG. 3M.

The passivation material may be patterned using an additional mask to expose the bonding pads. Such patterning may be done to define and open "windows" inside the passivation to expose where the connections will be formed (e.g., bond wires, probes, etc. . . . ).

Figure 4A:
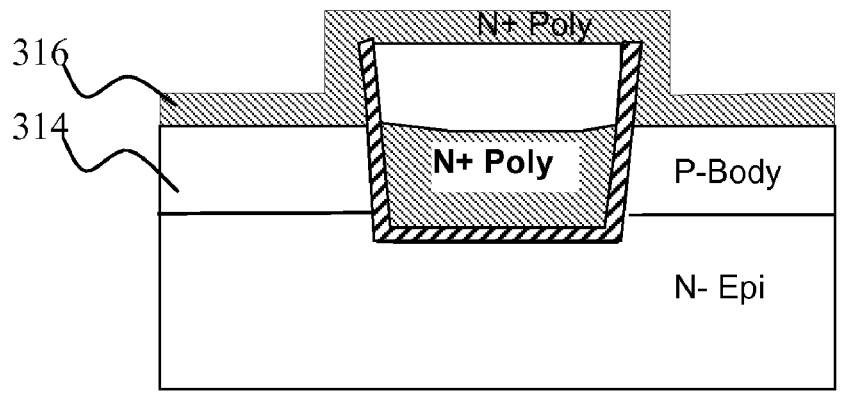
FIGS. 4A-4F are cross-sectional views illustrating a method for manufacturing the MOSFETs of the types depicted in FIG. 2B.

FIGS. 4A-4F are cross-sectional views illustrating an alternative method of fabrication of a trench MOSFET of the types depicted in FIG. 2B. FIG. 4A is the same as FIG. 3I as described above. The process described with respect to FIGS. 3A-3I may be used to produce the structure shown in FIG. 4A.

Figure 4B:
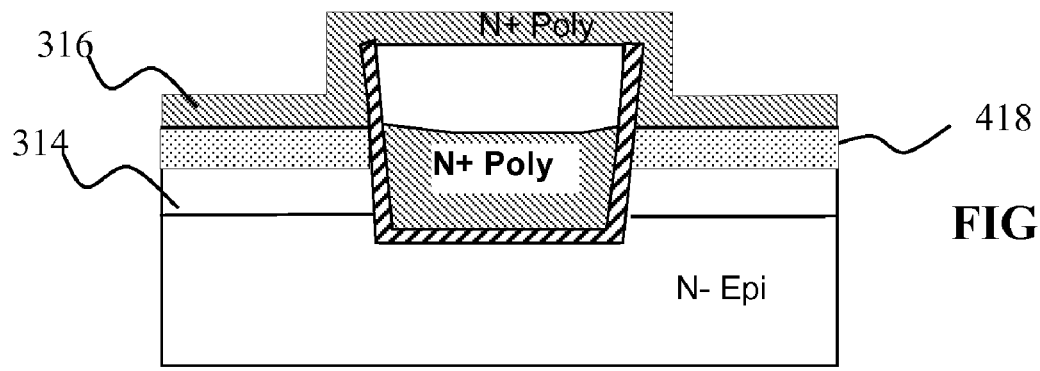

The highly doped N+ polysilicion layer 316 is annealed using Rapid Thermal Process (RTP) of diffusion furnace, thereby N+ is diffused out of the highly doped N+ polysilicion layer 316 into the top portion of the P-body layer 314 to form N+ source diffusion layer 418 as shown in FIG. 4B.

Figure 4C:
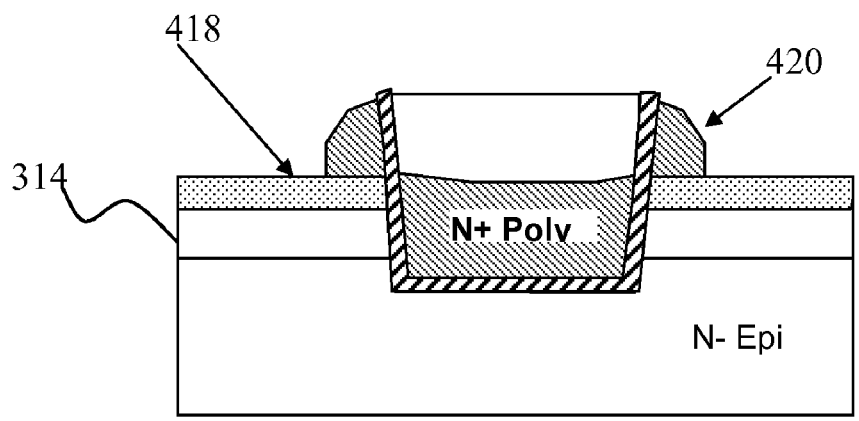

Portions of the highly doped N+ polysilicion layer 316 are then etched back, using an anisotropic etch selective to the material of the cap insulator 312, to a end-point when N+ polysilicon layer 316 is cleared from the surface of the source diffusion layer 418, to form highly doped N+ polysilicion spacer 420 as shown in FIG. 4C.

Figure 4D:
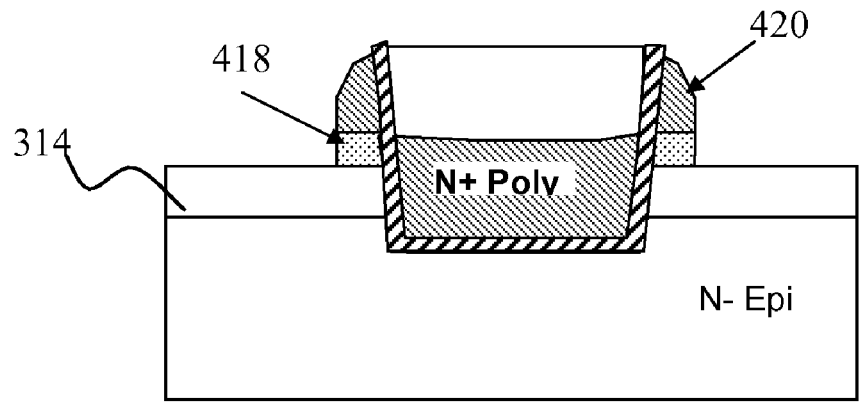

The exposed N+ source diffusion layer 418 is then further anisotropically etched down to a depth equivalent to the N+ source depth to form N+ source diffusion region as shown in FIG. 4D.

Figure 4E:
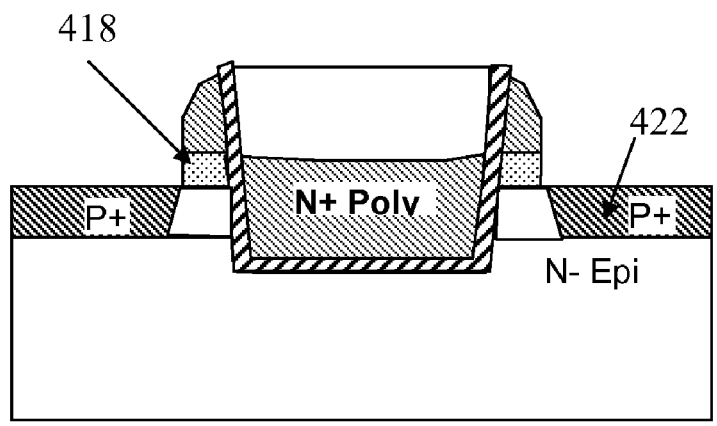

As shown in FIG. 4E, P+ type dopant may be vertically implanted in the exposed top surface of the P-body layer 314 to form a P+ body contact region 422. In this embodiment, the spacer 420 acts as a self-aligned mask for the implantation of the P+ type dopants. As a result, the body contact region 422 may touches the P-body layer 314 and may touch the source region 418 at a corner of the source region.

Figure 4F:
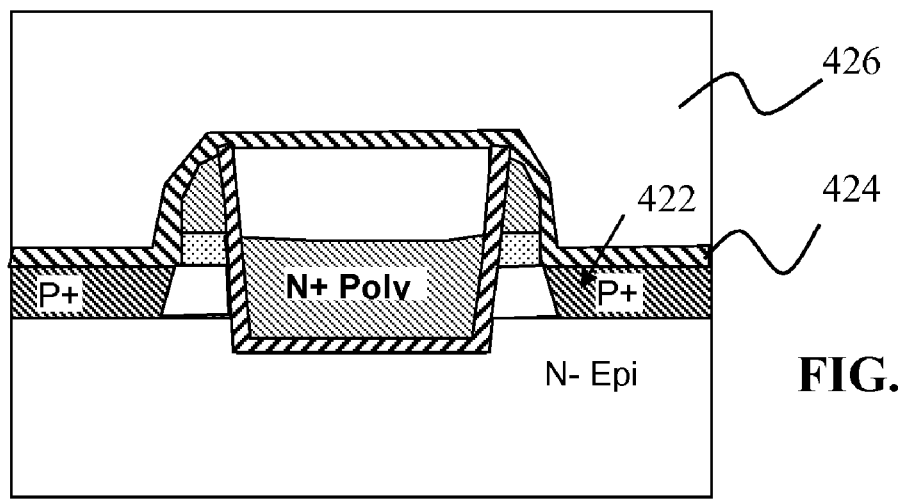

The resulting structure may then be etched through a third mask to provide vias for gate contacts (not shown). As shown in FIG. 4F, the semiconductor device is completed by depositing a barrier metal 424 (such as Ti, TiN, Ti/TiN, TiW, TiWN, thickness in the 200A to 1500A range ) on top of the P-body contact region 422, the N+ doped source diffusion region 418, the N+ doped polysilicon spacer 420 and the cap insulator 312 followed by the deposition and patterning of a top metal layer (thick aluminum, or AlCu alloy, 0.5 to 4 microns thick for example) 426. The metal may be patterned and etched using a fourth mask. The wafer may then be passivated, e.g., by coating it with a layer of oxide, nitride, or oxynitride, which is not shown in FIG. 4F. The passivation material may be deposited and etched using a fifth mask.

Figure 5A:
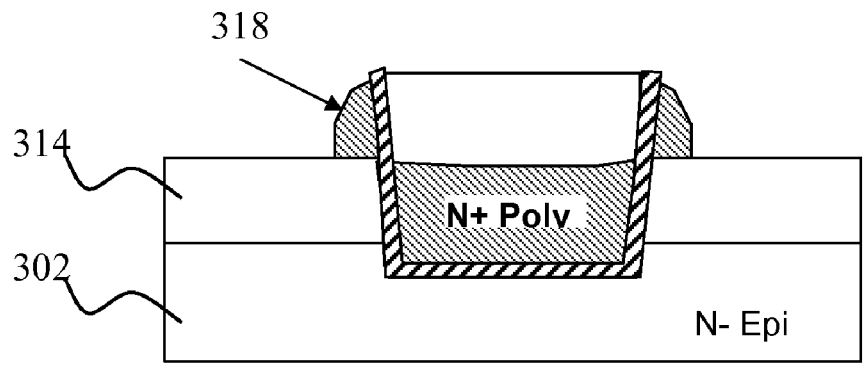
FIGS. 5A-5C are cross-sectional views illustrating an alternative method for manufacturing the MOSFETs of the types depicted in FIG. 2B.
Figure 5B:
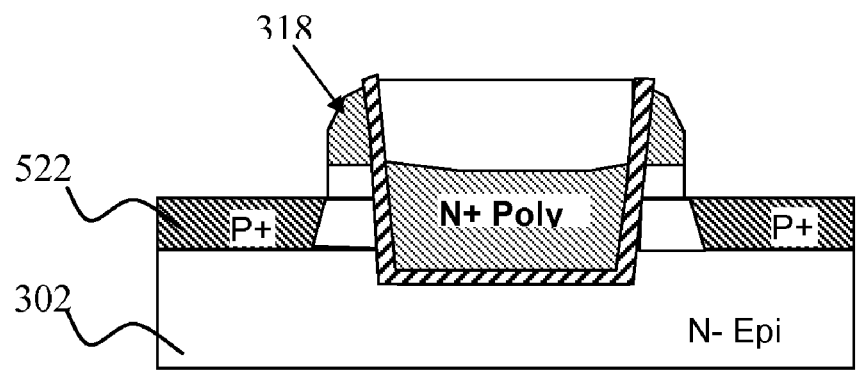
Figure 5C:
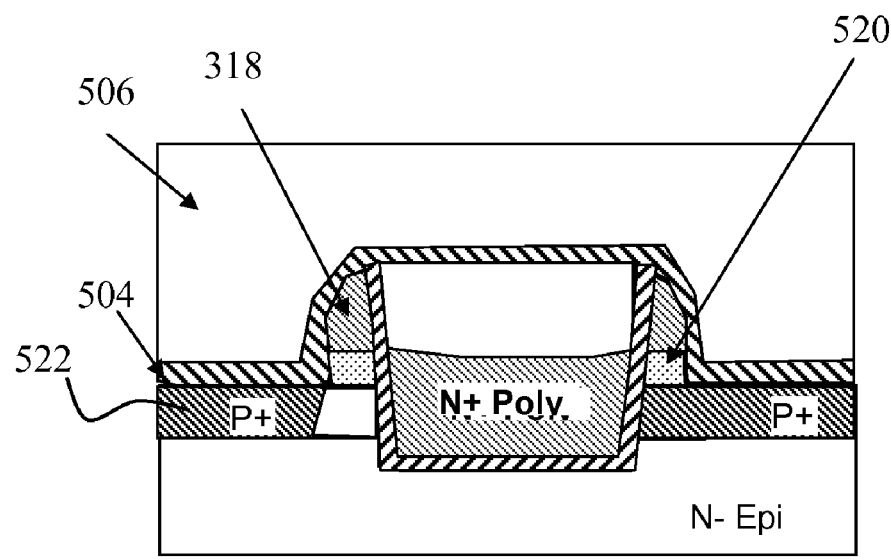

FIGS. 5A-5C are cross-sectional views illustrating an alternative method of fabrication of a trench MOSFET of the types depicted in FIG. 2B. FIG. 5A is the same as FIG. 3J as described above. The process described with respect to FIGS. 3A-3J may be used to produce the structure shown in FIG. 5A. Selected portions at the top surface of the P-body layer 314 may be etched back to recess body contact. P+ type dopant is then vertically implanted to a portion at the top surface of the remaining of the P-body layer 314 as shown in FIG. 5B to form body contact region 522.

The highly doped N+ polysilicon spacer 318 is annealed using Rapid Thermal Process (RTP) of diffusion furnace, thereby N+ is diffused out of the highly doped N+ polysilicion layer 316 into the un-etched portion at the top surface of the P-body layer 314 to form an N+ doped source region 520. This step may also anneal the body contact region 522. The resulting structure may then be etched through a third mask to provide vias for gate contacts (not shown). The semiconductor device is completed by depositing a barrier metal 504 (such as Ti, TiN, Ti/TiN, TiW, TiWN, thickness in the 200 Å to 1500 Å range) on top of the P-body layer 314, the N+ doped source region 520, the N+ doped polysilicon spacer 318 and the oxide 312 followed by the deposition and patterning of a top metal layer (thick aluminum, or AlCu alloy, 0.5 to 4 microns thick for example) 506 as shown in FIG. 5C. The wafer may then be passivated, e.g., with a layer of oxide, nitride, or oxynitride, which is not shown in FIG. 5C.

Figure 6A:
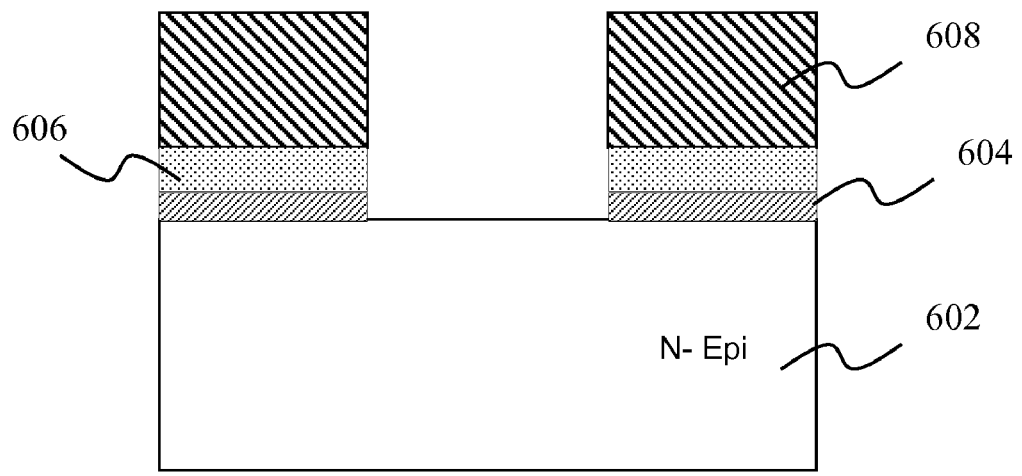
FIGS. 6A-6M are cross-sectional views illustrating a method for manufacturing the MOSFETs of the types depicted in FIG. 2A.

FIGS. 6A-6M are cross-sectional views illustrating another alternative method of fabrication of a trench MOSFET of the type depicted in FIG. 2A. This embodiment features a poly-stick-up approach without silicon etch in the active area to recess the channel. As shown in FIG. 6A, an N-type epitaxial semiconductor layer 602 may be grown on a highly doped substrate (not shown). A thin oxide layer 604 (e.g., having a thickness in the 150 Å to 500 Å range) is deposited on the N-type epitaxial layer 602. A nitride layer 606, having a thickness of about 300 Å to 2 KÅ, is deposited on top of the oxide layer 604.

An oxide hardmask 608 is then formed on a surface of the nitride layer 606, by patterning a thick oxide formed by a low temperature oxide (LTO) deposition technique or thermal oxidation, defined by a photoresist masking step followed by an oxide etch step. The oxide layer 604 and the nitride layer 606 are then fully etched through an opening in the oxide hardmask 608.

Figure 6B:
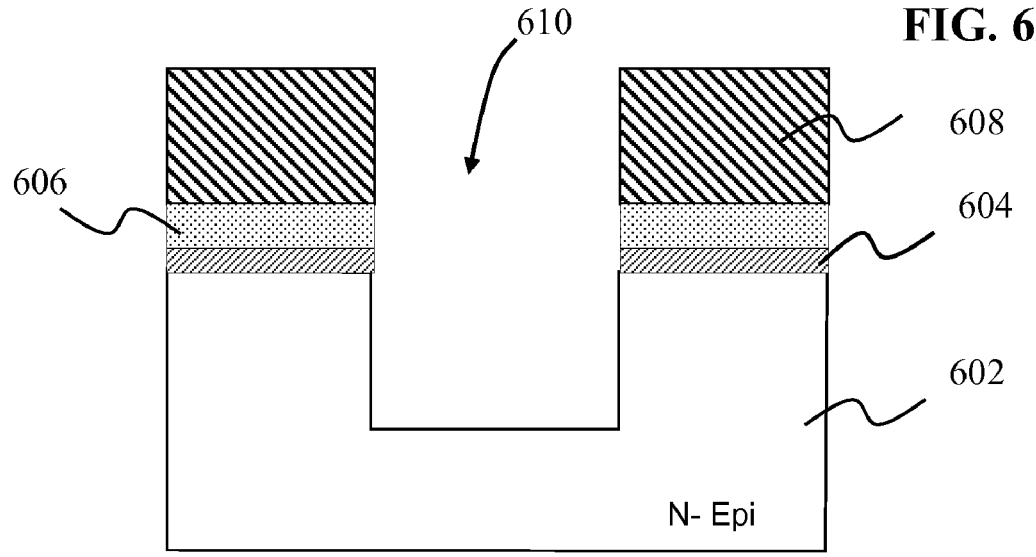
Figure 6C:
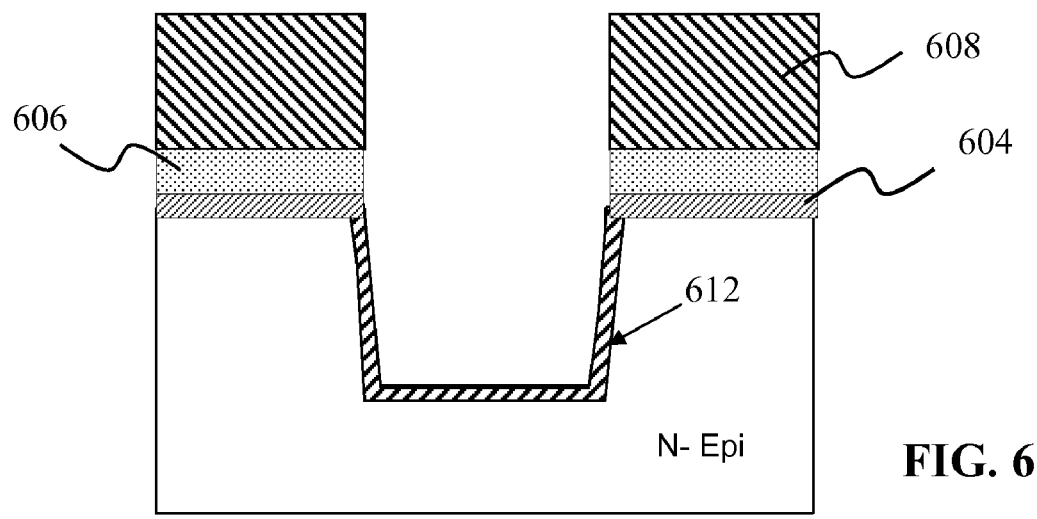
Figure 6D:
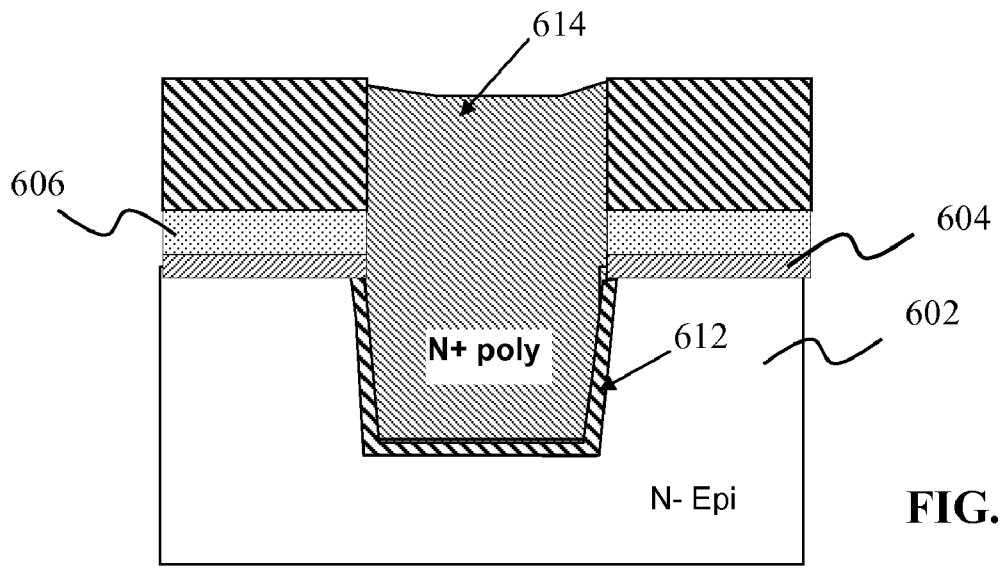

As shown in FIG. 6B, a trench 610 is then formed by reactive ion etching (RIE) the N-epi layer through the oxide hardmask 608 to a predetermined depth. Etched polymer may then be stripped and wafer cleaned at this point. As shown in FIG. 6C, a thin gate oxide 612 is formed on the sidewall and bottom of the trench 610 following a standard sacrificial oxidation growth and strip process. A conductive material, such as N+ polysilicon, is deposited into the remaining space in the trench 610. The polysilicon may be planarized by etchback or CMP, as shown in FIG. 6D.

Figure 6E:
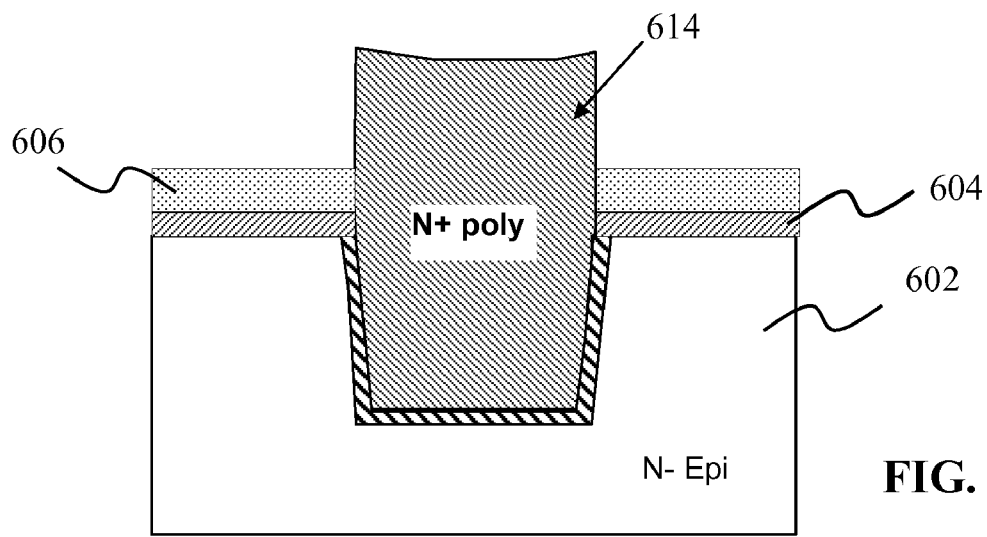
Figure 6F:
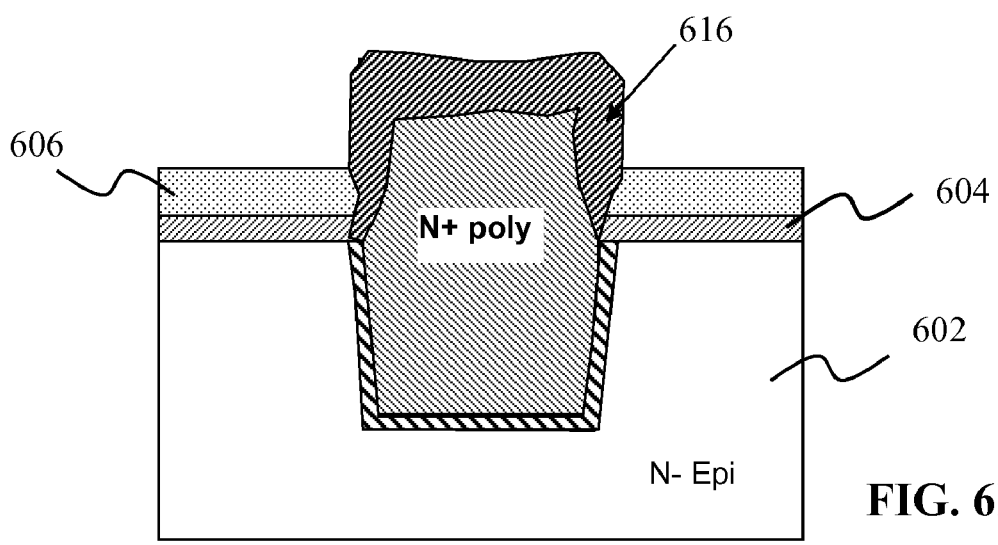

As shown in FIG. 6E, the oxide hardmask 608 (oxide) is stripped off down to the nitride layer 604 as shown in FIG. 6E. A mask may optionally be used to keep oxide in the field oxide region. Oxide 616 may be selectively thermally grown on the N+ polysilicon gate 614 as shown in FIG. 6F. The oxide will only grow on the exposed polysilicon gate region, since the other device regions are protected by a nitride layer 606, as shown in FIG. 6F.

Figure 6G:
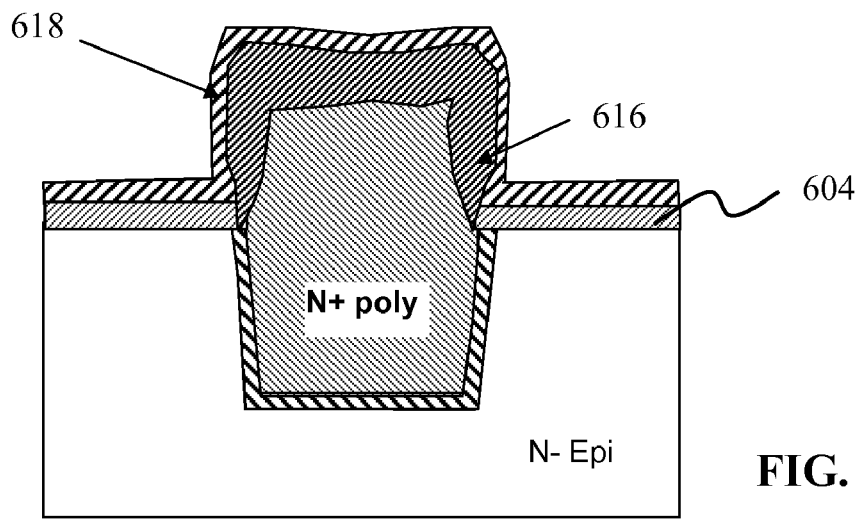

As shown in FIG. 6G, the nitride layer 606 is selectively etched off. A conformal oxide layer 618, having a thickness of about 150 Å to 700 Å, may be deposited on top of the oxide layer 604 and the oxide 616 using a high temperature oxidation (HTO) deposition technique.

Nitride materials tend to behave differently during manufacture than oxides. For example, certain nitrides do not oxidize during etch processes. Also, certain nitrides, like silicon nitride, are not etched in chemicals which can etch silicon dioxide. Consequently an oxide may be selectively etched while the nitride is not. Thus, it is possible to determine when to stop an etch process by determining when a layer of nitride has been removed from the top of an underlying oxide.

Figure 6H:
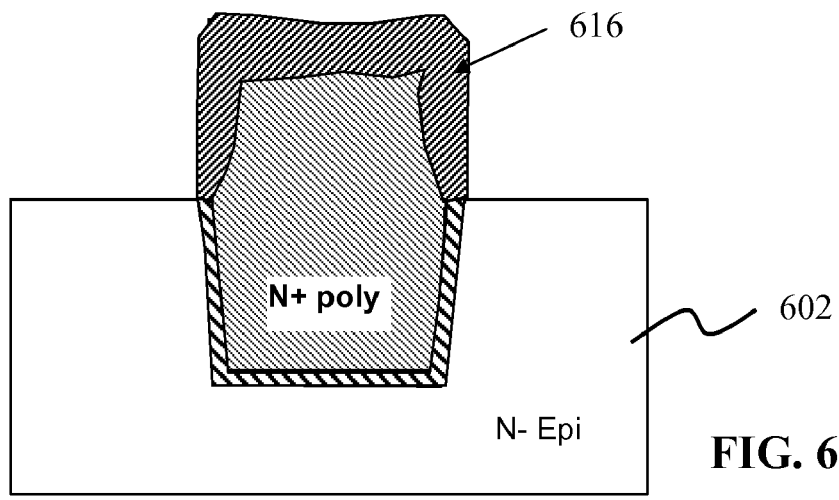

The structure may then be annealed preferably in nitrogen, at a temperature about 900° C. to 1050° C. using Rapid Thermal Process (RTP) or furnace. The oxides 618, 616 and 604 may be etched back using reactive ion etching (RIE) with an end-point occurring when the active horizontal surface of the N-Epi layer 602 is exposed as shown in FIG. 6H.

Figure 6I:
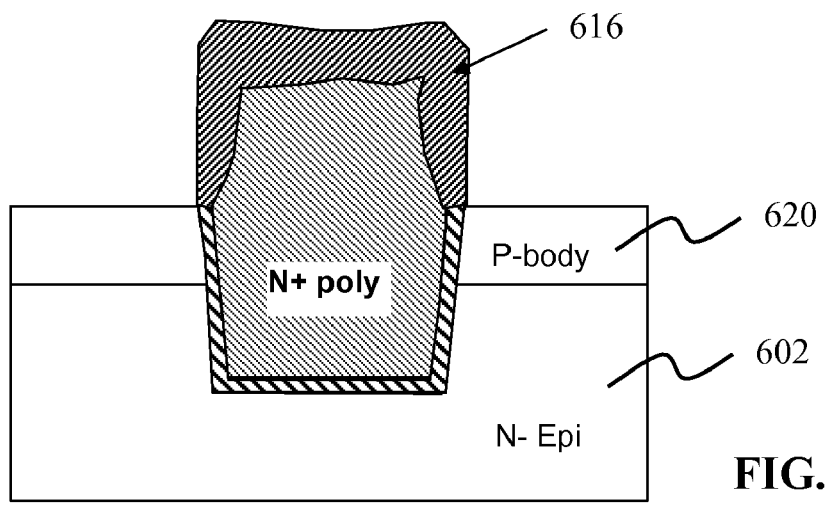
Figure 6J:
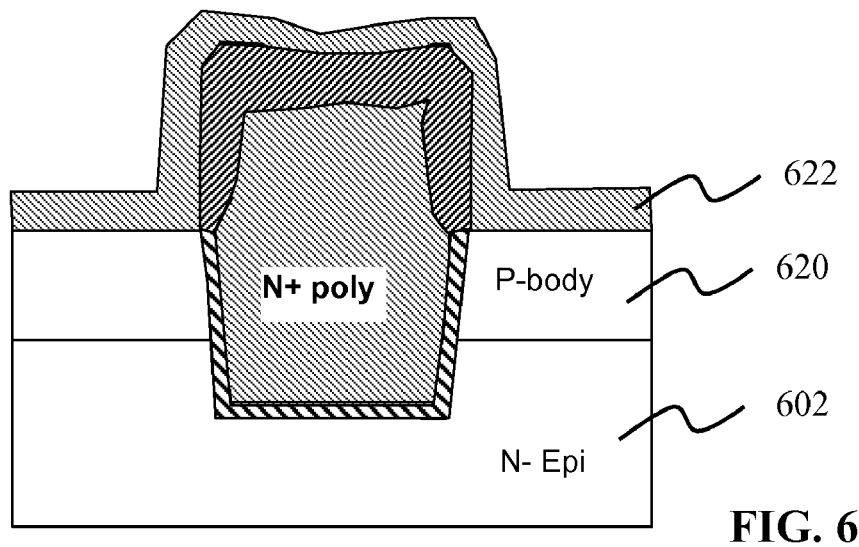

P-type dopants are blanket implanted (e.g., with zero tilt or some combination of tilt and rotation) in a top region of the N-Epi layer 602. A second mask may be used to form the termination region. The P-type dopants may then be diffused (e.g., by heating to about 950° C. to 1100° C. in nitrogen), thereby forming the P-body region 620 as shown in FIG. 6I. A highly doped N+ polysilicon layer 622, having a thickness of about 500 Å to 2 KÅ, is then deposited on top of the P-body region 620 and the oxide 616 as shown in FIG. 6J. The N+ doped polysilicon layer 622 can be in-situ doped N+ (for N-channel), or can be implanted using POCl$_3$ diffusion or multiple tilted and rotated implants if it is deposited undoped.

Figure 6K:
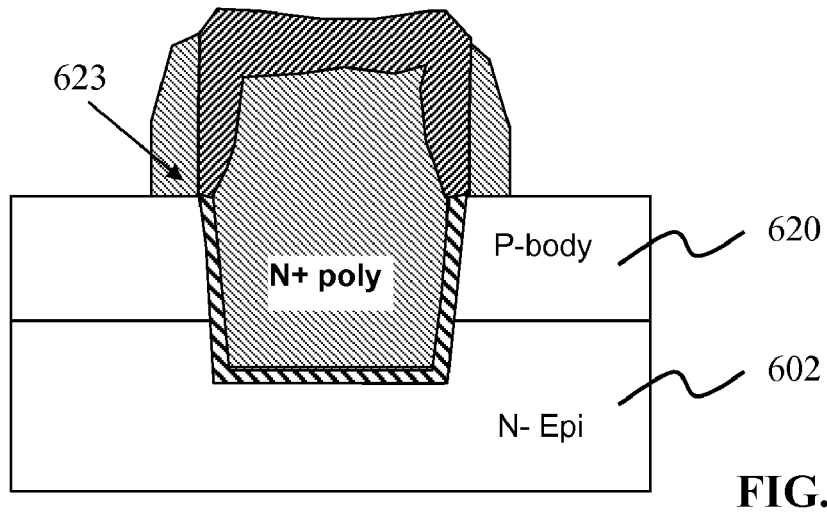

The highly doped N+ polysilicon layer 622 may be anisotropically etched using reactive ion etching (RIE) with an end-point occurring when the active horizontal surface of the P-body region 620 is clear, thereby forming N+ doped polysilicon spacer 623 as shown in FIG. 6K. Over-etch in the active region does not impact the structure since the source and channel are self-aligned along the trench sidewalls.

Figure 6L:
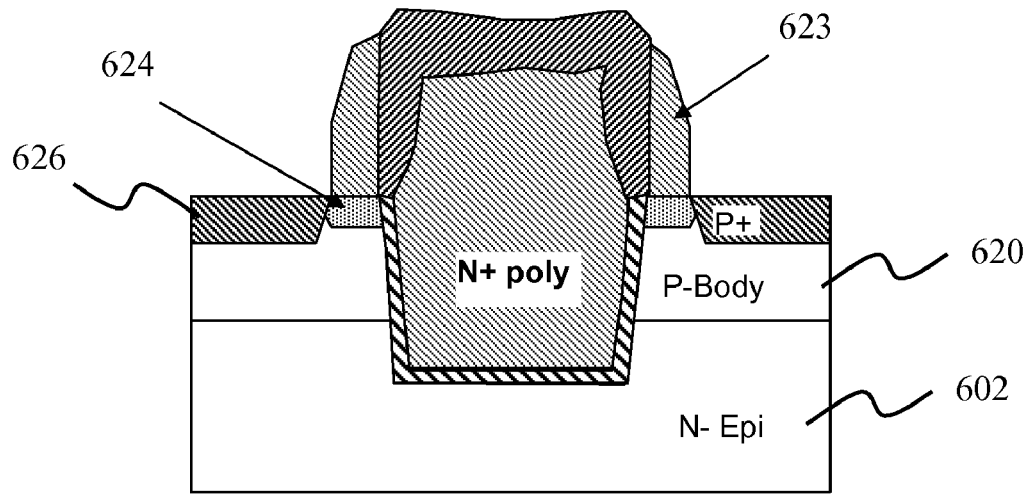

P-type dopants, such as Boron, may be vertically implanted into top portions of the P-body region 620, which are not covered by the N+ doped polysilicon spacer 623 to form a P-body contact region 626. The highly doped N+ polysilicon spacer 623 may then be annealed using Rapid Thermal Process (RTP) of diffusion furnace, thereby diffusing N+ dopants out of the highly doped N+ polysilicion layer 623 and into a top portion at the top surface of the P-body region 620 to form an N+ source diffusion layer 624 in a self-aligned fashion, as shown in FIG. 6L.

Figure 6M:
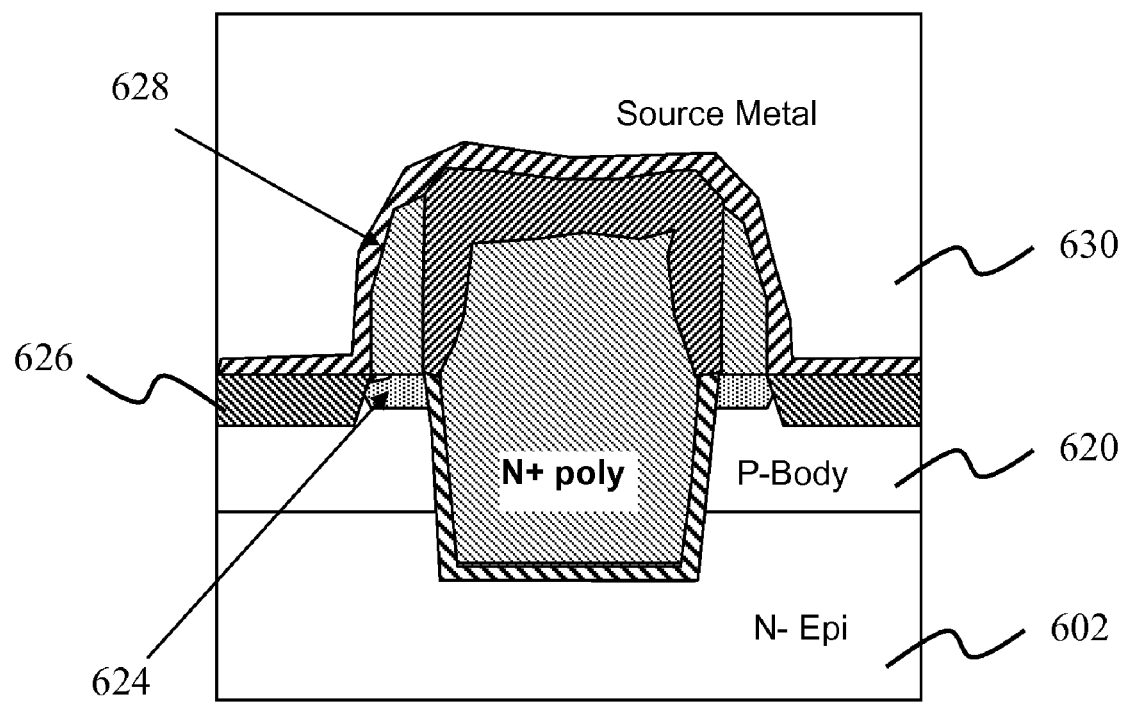

The resulting structure may then be etched through a third mask to provide vias for gate contacts. The semiconductor device may be completed by depositing a barrier metal 628 (such as Ti, TiN, Ti/TiN, TiW, TiWN, having a thickness in the 200 Å to 1500 Å range) on top of the P-body contact 626, the N+ doped polysilicon spacer 623 and the oxide 616 followed by the deposition and patterning of a top metal layer (e.g., thick aluminum, or AlCu alloy, 0.5 to 4 microns thick for example) 630 as shown in FIG. 6M. The metal may be patterned and etched using a fourth mask. The wafers are then passivated, e.g., with a layer of oxide, nitride, or oxynitride, which is not shown in FIG. 6M. The passivation material is then etched using a fifth mask to form bonding pad openings.

Figure 7A:
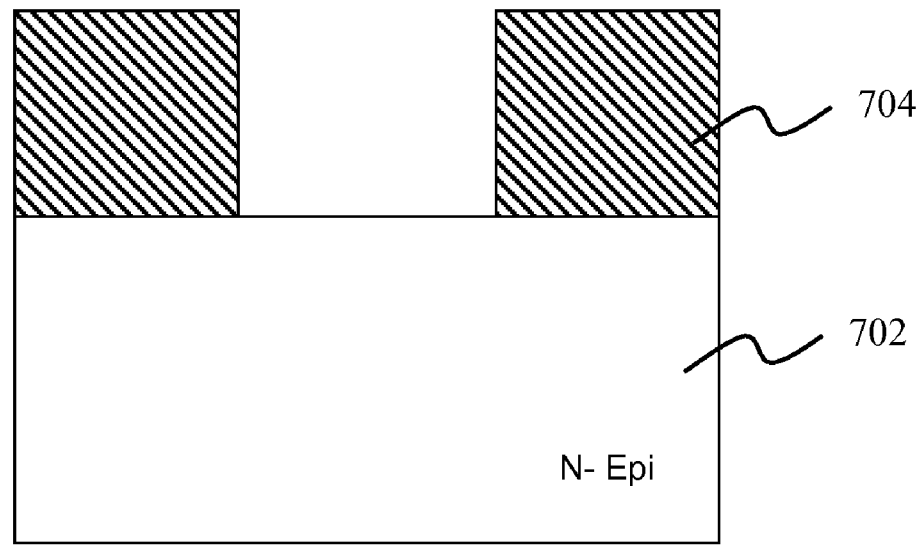
FIGS. 7A-7P are cross-sectional views illustrating a method for manufacturing the MOSFETs of the types depicted in FIG. 2C.
Figure 7B:
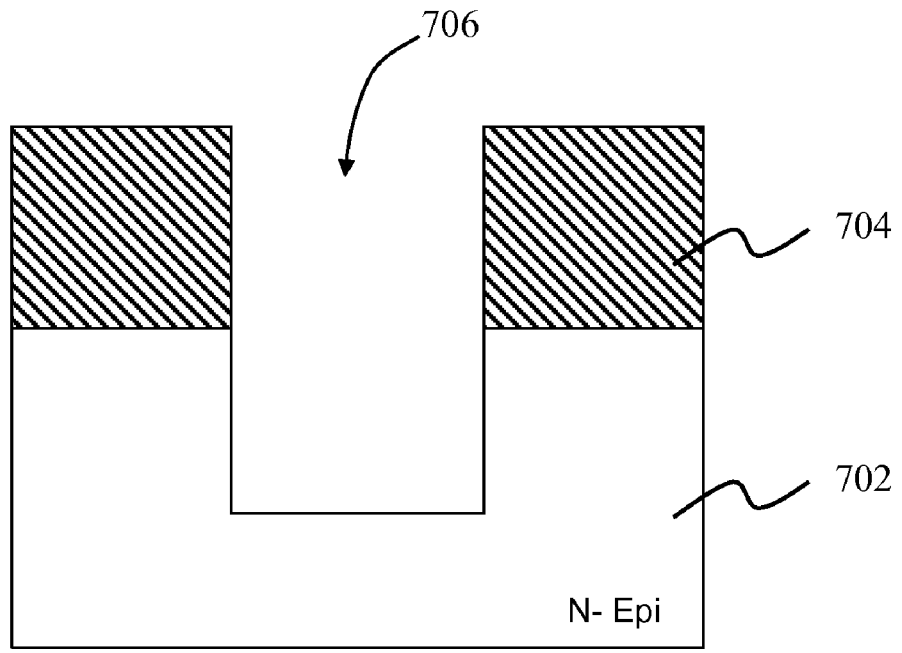
Figure 7C:
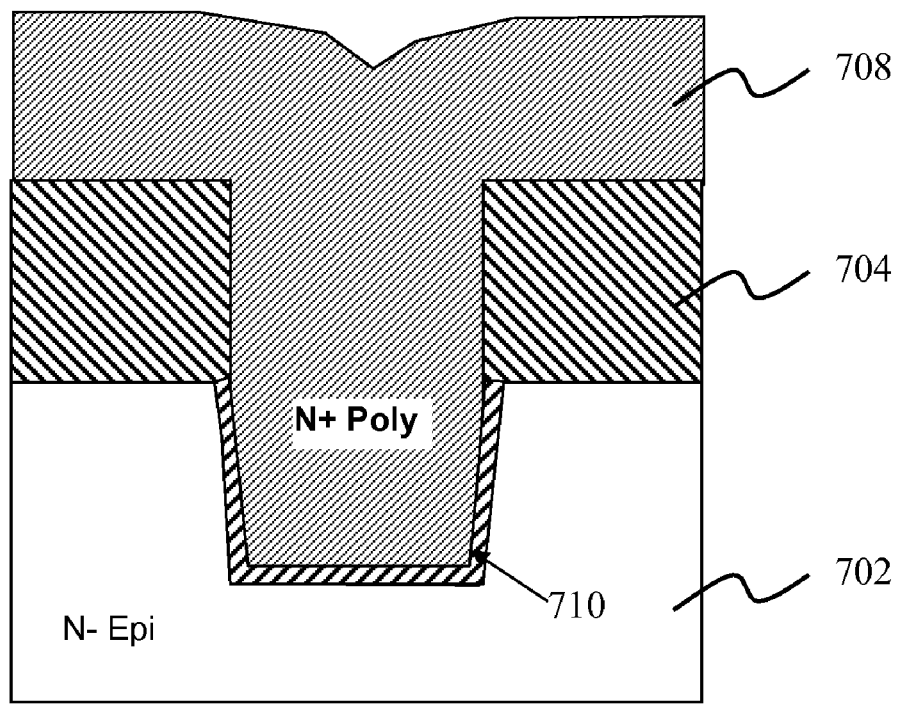
Figure 7D:
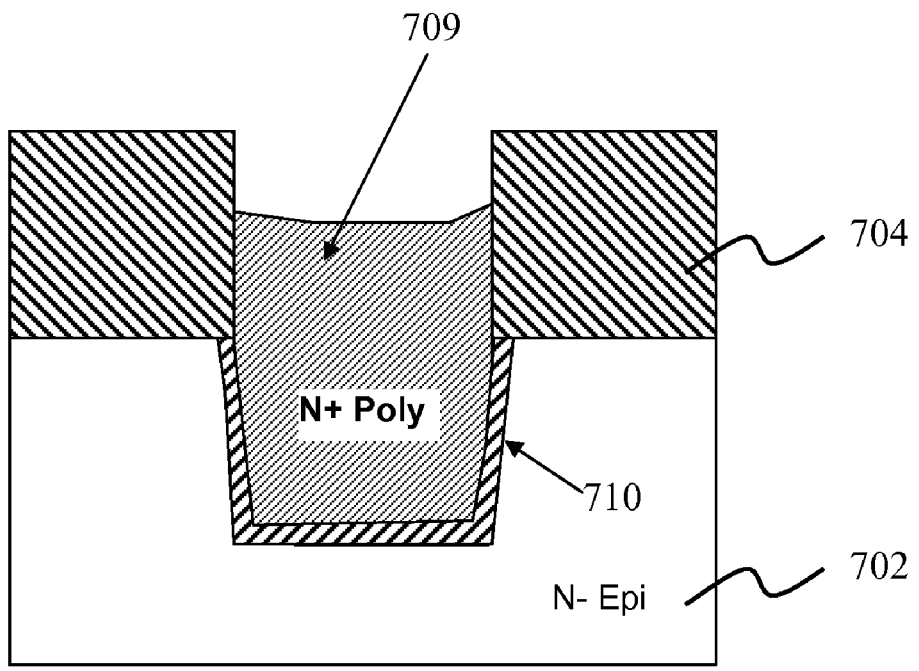
Figure 7E:
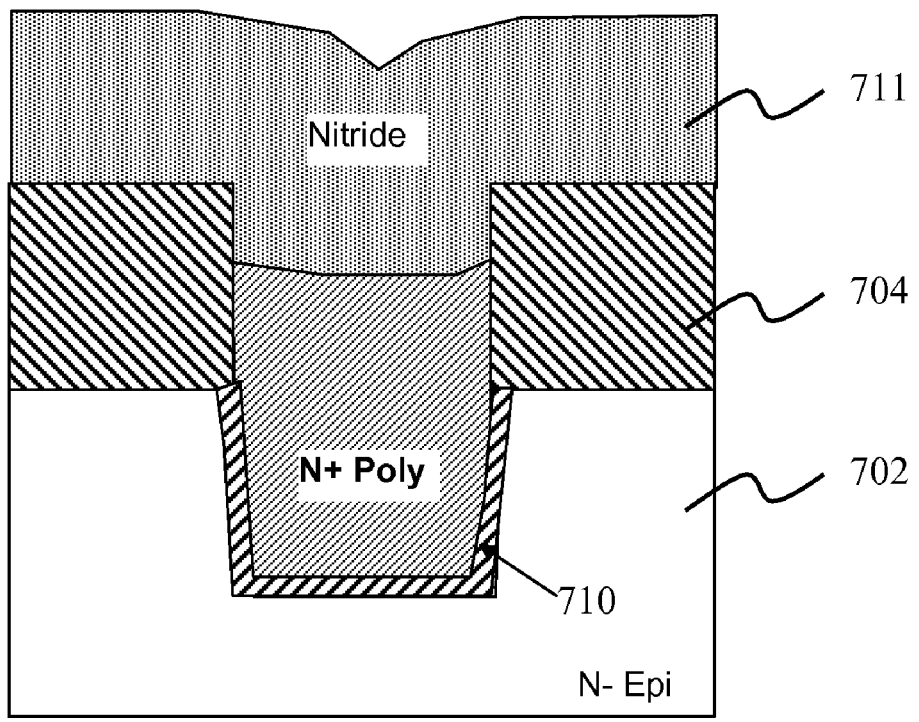
Figure 7F:
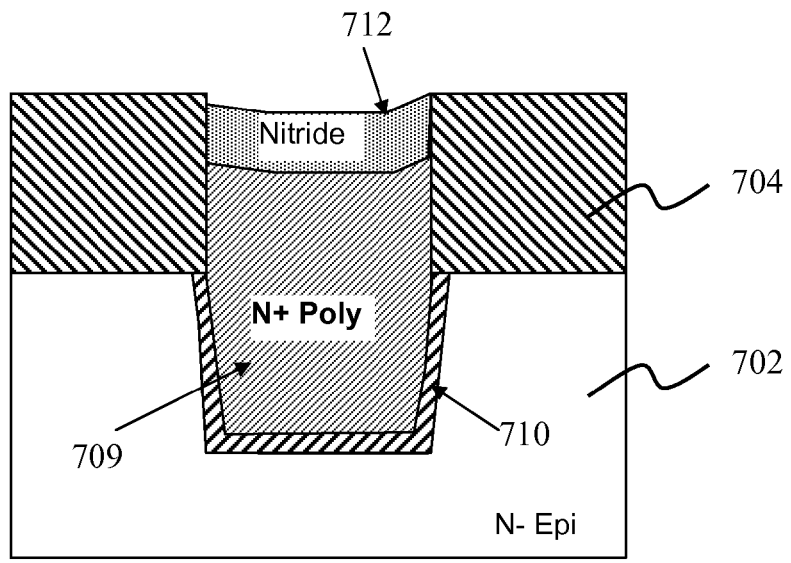
Figure 7G:
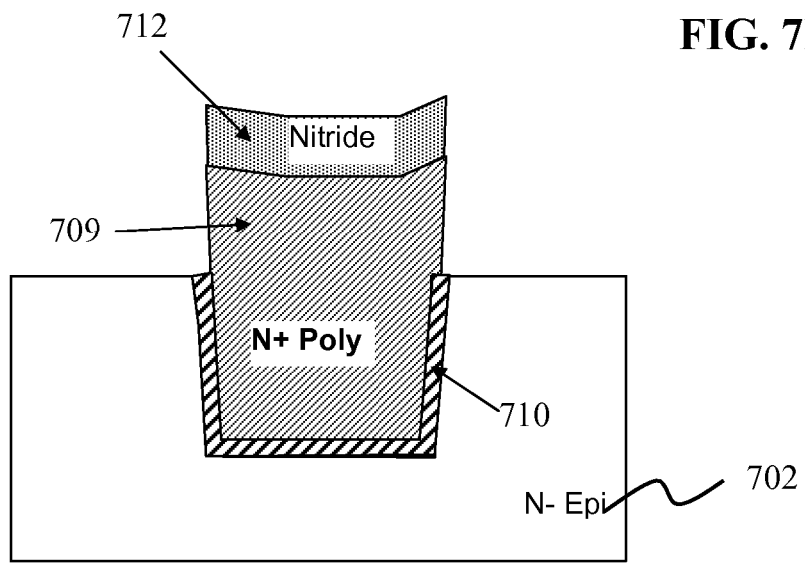
Figure 7H:
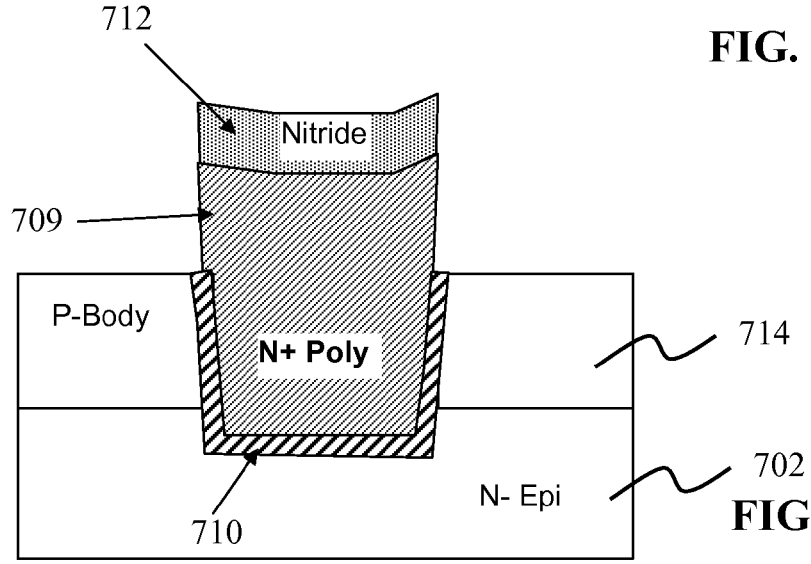
Figure 7I:
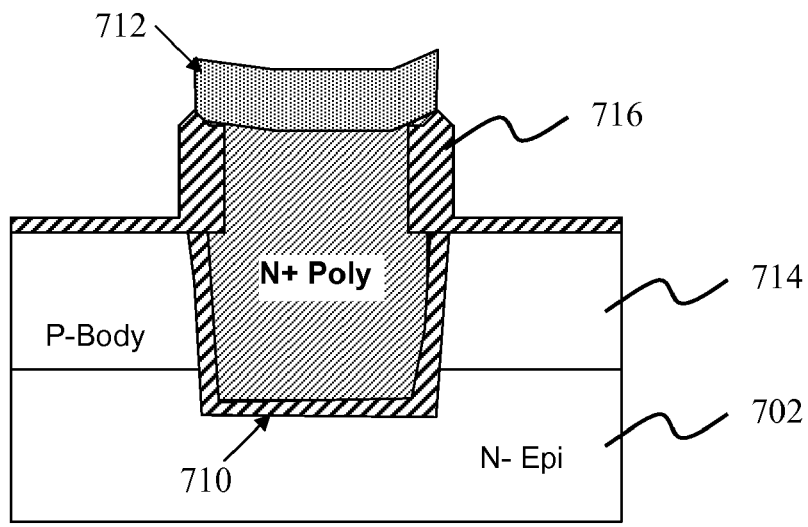
Figure 7J:
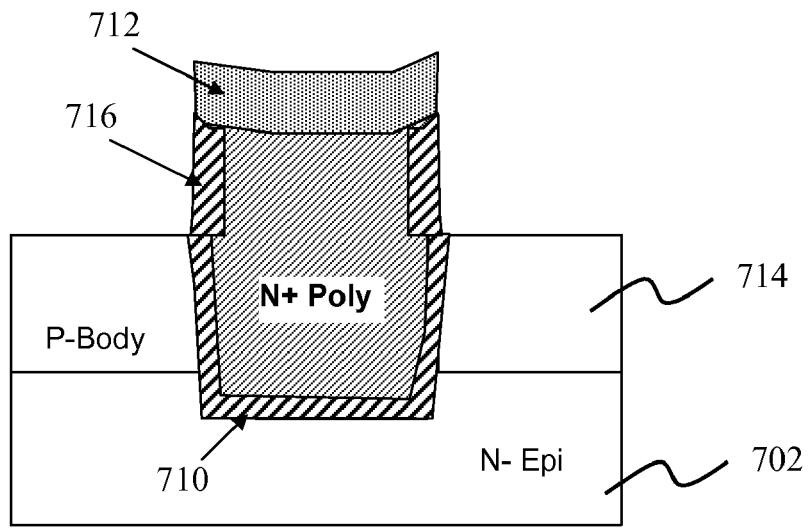
Figure 7K:
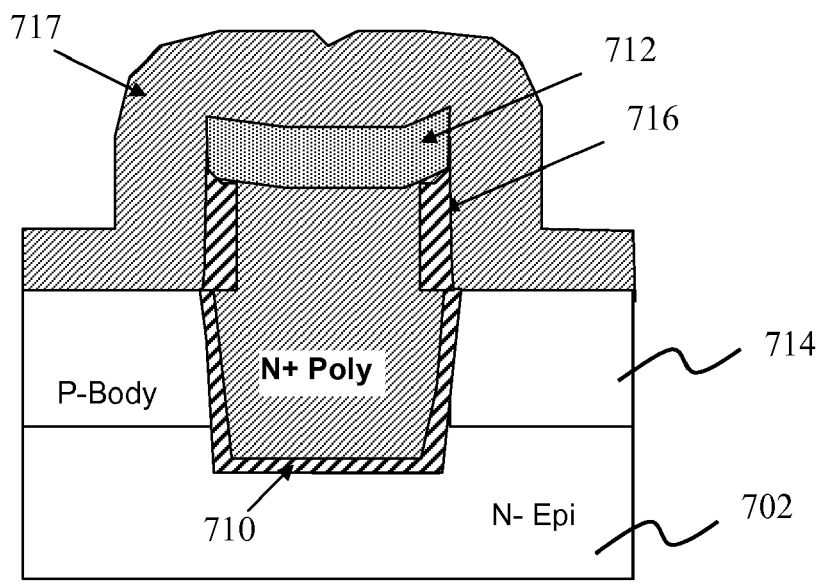
Figure 7L:
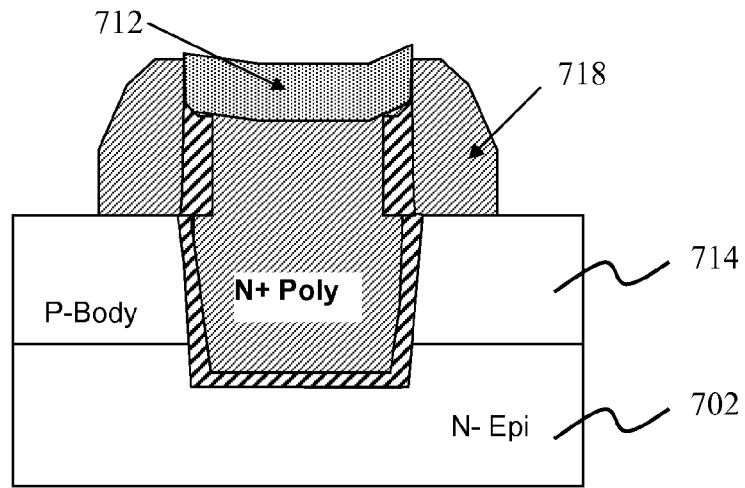
Figure 7M:
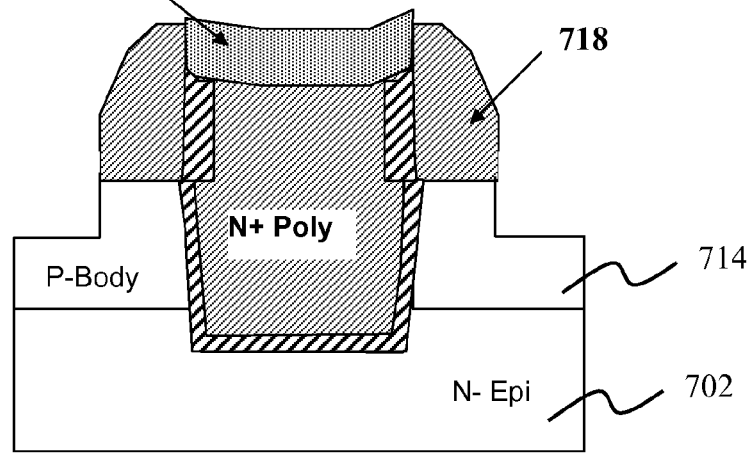
Figure 7N:
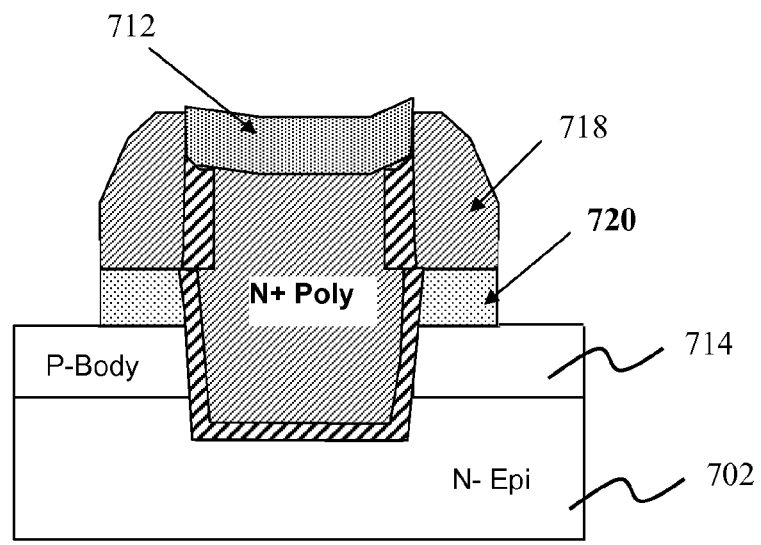
Figure 7O:
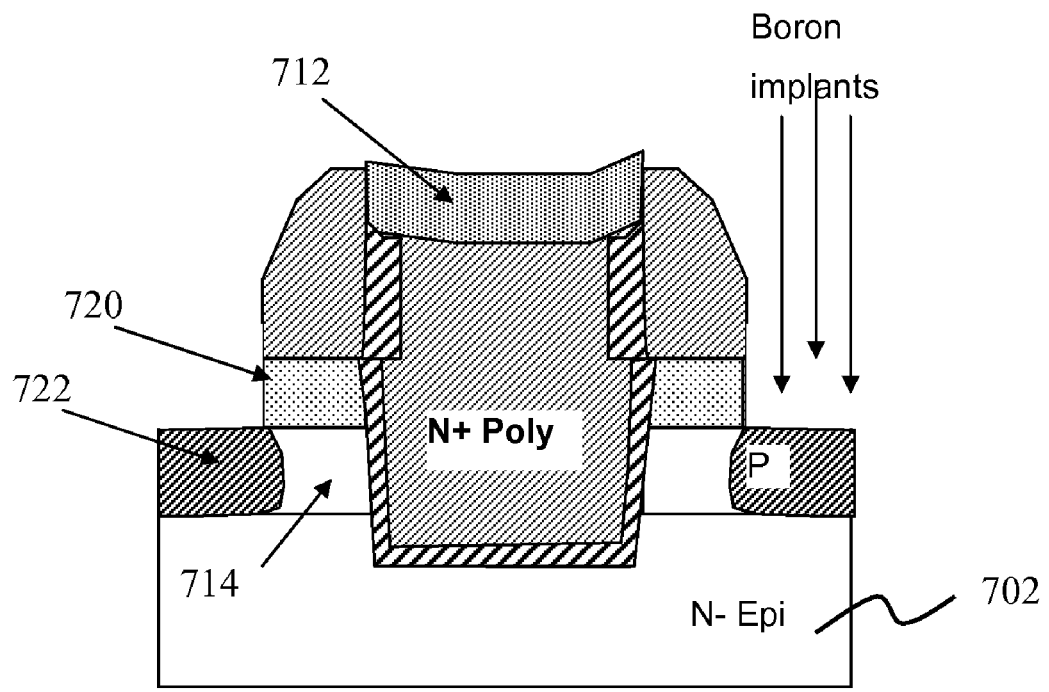
Figure 7P:
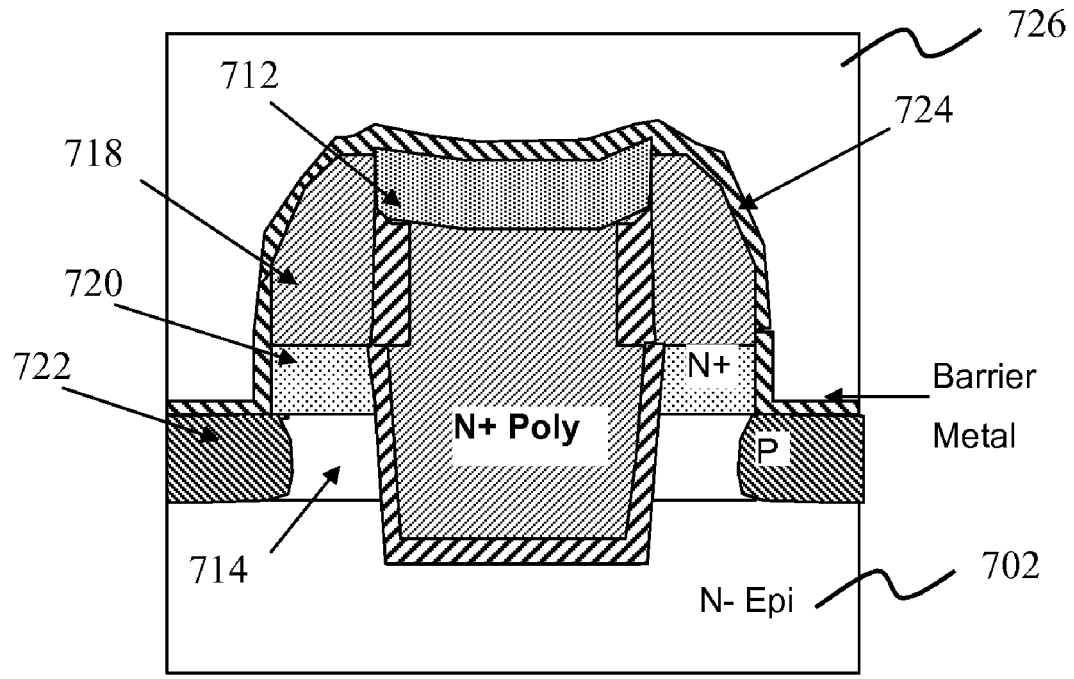

FIGS. 7A-7P are cross-sectional views illustrating a method of fabrication of trench MOSFET employing a nitride insulator cap. The resulting structure is similar to that shown in FIG. 2C. This method can be modified to produce other structures. As shown in FIG. 7A, an N-type epitaxial semiconductor layer 702 may be grown on a substrate which is not shown, (typically highly doped N+ for an N-channel device). A first mask 704, sometimes referred to herein as a trench mask, is then formed on a surface of the N-epi layer 702, e.g., by patterning an oxide hardmask formed using a low temperature oxide (LTO) deposition technique or thermal oxidation, etched by a photoresist mask.

As shown in FIG. 7B, a trench 706 is then formed by reactive ion etching (RIE) the N-epi silicon layer 702 through the trench mask 704 to a predetermined depth. Etched polymer may then be stripped and wafer cleaned at this point. As shown in FIG. 7C, a thin gate insulator 710, e.g., an oxide, is formed on the sidewall and bottom of the trench 706, e.g., using thermal oxidation, following a standard sacrificial oxide growth and etch procedure. A conductive gate electrode material 708, such as N+ doped polysilicon, is deposited into the remaining space in the trench 706 and on top of the trench mask 704. The conductive material 708 is then etched back to a level below the top surface of the trench mask 704 to form a trenched gate 709 as shown in FIG. 7D.

As shown in FIG. 7E, a nitride insulator layer 711, e.g., silicon nitride, is formed on top of the trenched gate 709 and the trench mask 704. As shown in FIG. 7F, the nitride insulator layer 711 is etched back or CMPed to roughly the same level as the top surface of the trench mask 704 leaving behind a nitride cap 712 that does not extend beyond the sidewalls of the gate 709. The trench mask 704 is stripped away as shown in FIG. 7G. A body region 714 is formed by ion implantation and diffusion in the top portion of the N-epi layer 702 as shown in FIG. 7H. This body implant is self-aligned to the nitride cap 712, but a mask may be used to form the termination region (not shown). By way of example, and not by way of limitation, Boron ions may be implanted into the N-epi layer at an energy of 20 to 100K eV, and a dose of $3 \times 10^{12}$ to $1 \times 10^{14}$ to form the body region of an N-channel device, for example. The ions may then be and diffused, e.g., by heating at 950° C. to 1100° C.

As shown in FIG. 7I, a thin oxide 716 may be formed on the sidewalls of the trenched gate 709 and on top of the P-body region 714, e.g., using thermal oxidation. Oxide grows thicker on the sidewalls of the trenched gate 709. The oxide 716 is then anisotropically vertically etched to remove portions of the oxide 716 not underlying the nitride cap 712 as shown in FIG. 7J. The nitride in the cap 712 acts as a mask for this etch process. Then, a highly doped N+ polysilicon layer 718, having a thickness about 500 Å to 2 KÅ, is deposited on a top of the P-Body region 714 and the nitride cap 712 as shown in FIG. 7L. The polysilicon layer 718 can be in-situ doped N-type during deposition, or ion-implanted after deposition using either Arsenic or Phosphorus (at a dose of $1 \times 10^{15}$ to $5 \times 10^{15}$, energy 20K eV to 60K eV), if the Polysilicon layer 717 was deposited undoped. The N+ polysilicon layer 717 is then anisotropically etched back, using an etch process that is selective with respect to the material of the nitride cap 712, until the N+ polysilicion is clear from flat surfaces to form a highly doped N+ polysilicon spacer 718 primarily disposed proximate the gate oxide 716 on the sidewalls of the nitride cap 712 as shown in FIG. 7L. Thus N+ polysilicion spacers 718 are self-aligned to the nitride cap 712.

As shown in FIG. 7M, selected portions at the top surface of the P-body layer 714 may be etched back to recess body contact. This etch is self-aligned to the highly doped N+ polysilicion spacer 718 and the nitride cap 712. The highly doped N+ spacer 718 may then be annealed using Rapid Thermal Process (RTP) of diffusion furnace. The heating diffuses N+ dopants out of the highly doped N+ polysilicion spacer 718 to form an N+ source region 720 in the P-body region 714 as shown in FIG. 7N. Thus the N+ source region 720 is self-aligned to the polysilicon spacer 718.

As shown in FIG. 7O, P+ type dopants are vertically implanted into one or more portions of the P-body layer 714 that are not covered by the spacer 718 and N+ source region 720 to form a P+ body contact region 722. The spacer 718 may act as a mask for the implantation of the dopants into the P-body contact region 722, thus the P+ body contact region 722 is self-aligned to the polysilicon spacer 718 and the nitride cap 712. The implant can be a single or a combination of implants with the same conductivity type as the body region, such as boron or BF2, with energies in the 10 to 100K eV range, and doses in the $5 \times 10^{13}$ to $4 \times 10^{15}$ range. Alternatively, the body contact implant can be performed before the annealing step shown in FIG. 7N, and then be annealed together with the N+ source region 720.

The resulting structure may then be completed by applying a non-critical mask to define gate contact regions, by providing vias through the gate cap dielectric 712 (not shown).

As shown in FIG. 7P, the semiconductor device may be completed by depositing a barrier metal 724 (such as Ti, TiN, Ti/TiN, TiW, TiWN, thickness in the 200 Å to 1500 Å range) on top of the P-body contact region 722, the N+ source region 720, the N+ doped polysilicon spacer 718 and the nitride cap insulator 712 followed by the deposition and patterning of a top metal layer (thick aluminum, or AlCu alloy, 0.5 to 4 microns thick for example) 726. The metal may be patterned and etched using a mask which defines the gate and source electrodes and the locations where the electrodes can be contacted. The resulting structure may then be passivated, e.g., with a layer of oxide, nitride, or oxynitride, which is not shown in FIG. 7P. The passivation material may be patterned using an additional mask to expose the bonding pads. Such patterning may be done to define and open "windows" inside the passivation to expose where the connections will be formed (bond wires, probes, etc. . . . ).

The methods described above provide the semiconductor devices with smaller cell pitch. With a 0.35 um process, a pitch of 1 micron or less maybe feasible (0.35 um trench+0.35 um trench contact+0.2 us space). In addition, these methods have higher yield due to tight control of source contact to gate spacing, improves source contact since the entire sidewall is N+ source and lower number of masks possible. Embodiments of the present invention may be implemented with only five masks with passivation and termination.

Embodiments of the present invention allow for the fabrication of N-channel or P-channel devices with low contact resistance and parasitic bipolar action. It is noted that although the foregoing examples relate to N-channel devices and their fabrication, those of skill in the art will recognize that the same teachings may be applied to P-channel devices and their fabrication. Since semiconductor materials of opposite polarity (e.g., P-type and N-type) differ primarily in the polarity of the dopants used, the above teachings may be applied to P-channel devices by reversing the polarity of the semiconductor layers and dopants discussed above.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for manufacturing a vertical semiconductor device comprising:
   a) forming a body layer in an epitaxial layer wherein the epitaxial layer is of a first semiconductor type and the body layer is of a second semiconductor type;
   b) forming a trench in the epitaxial layer, wherein b) includes forming a thin oxide layer on the epitaxial layer; forming a nitride layer on top of the thin oxide layer; forming a thick oxide layer on top of the nitride layer; and etching the epitaxial layer through one or more openings in the thick oxide layer, nitride layer and thin oxide layer to form the trench;
   c) lining a bottom and one or more sidewalls of the trench with a gate insulating layer;
   d) forming a gate electrode in the trench in the body layer and epitaxial layer, wherein a gate oxide is disposed between the gate electrode and the body layer and between the gate electrode and the epitaxial layer, wherein d) includes depositing conductive material in the trench wherein the gate oxide is disposed between the conductive material and the epitaxial layer; and etching the thick oxide layer down to the nitride layer leaving a portion of the conductive material protruding above an exposed surface of the nitride layer such that at least a portion of the gate electrode protrudes above a surface of the epitaxial layer;
   e) forming a cap insulator over the gate electrode, wherein e) includes oxidizing the portion of the conductive material protruding above an exposed surface of the nitride layer;
   f) etching back around the cap insulator such that the top of the gate electrode is even with or protrudes above a surface of the epitaxial layer;
   g) forming a spacer on the epitaxial layer self-aligned to the cap insulator, wherein the spacer includes a heavy concentration of dopants of the first semiconductor type and wherein the spacer is self-aligned to the cap insulating layer, and wherein forming the spacer comprises depositing a layer of material and then anisotropically etching back the layer of material with an etch selective to the insulator cap such that only the spacer is left;
   h) diffusing at least a portion of the dopants of the spacer into the body layer to form a source region below the spacer wherein the source region is of the first semiconductor type;
   i) implanting a body contact region containing dopants of a second semiconductor type in the body layer and annealing the body contact region, wherein implanting a body contact region is self-aligned to the spacer; and
   j) forming a metal layer over the insulator cap, spacer, source region and body Contact region.

2. The method of claim 1 wherein h) is performed the same time as annealing the body contact region in i).

3. The method of claim 1, wherein g) further comprises continuing the anisotropic etching such that the body layer next to the spacer is etched back below the bottom of the spacer.

4. The method of claim 3 wherein h) is performed after depositing the layer of material in g), but before anisotropically etching in g).

5. The method of claim 3 wherein h) is performed the same time as annealing the body contact region in i).

6. The method of claim 3, wherein g) further comprises anisotropic etching such that the body layer next to the spacer is etched back to the level of the bottom of the source region of the finished device.

7. The method of claim 1 wherein f) includes etching back the epitaxial layer such that at least a portion of the gate electrode protrudes above a surface of the eptiaxial layer.

8. The method of claim 1 wherein the first semiconductor type is N-type, and the second semiconductor type is P-type.

9. The method of claim 1 wherein a) is after f).

10. The method of claim 1 wherein b) includes forming a hardmask oxide; d) includes forming a conductor layer that protrudes above the top of the epititaxial layer;
    wherein e) includes forming an cap insulator comprising nitride; and wherein f) includes selectively etching away the hardmask oxide.

11. The method of claim 1 wherein the first semiconductor type is P-type, and the second semiconductor type is N-type.

12. A method for manufacturing a vertical semiconductor device comprising:
    a) patterning a mask on an epitaxial layer, wherein the mask includes a thin oxide layer on a surface of the epitaxial layer, a nitride layer on the thin oxide layer and a hardmask layer on the nitride layer, wherein the patterning forms one or more openings through the hardmask, nitride and oxide layers exposing an underlying portion of the epitaxial layer, wherein the epitaxial layer is doped with a first semiconductor type dopants;
    b) removing material from the epitaxial layer underlying the opening to form a trench;
    c) lining a bottom and one or more sidewalls of the trench with a gate insulating layer;
    d) filling the trench and opening in the mask with to form a gate electrode, wherein a gate oxide is disposed between the gate electrode and epitaxial layer;
    e) removing the hardmask layer down to the nitride layer such that a portion of the gate electrode protrudes above a surface of the thin oxide layer;
    f) forming a cap insulator on exposed portions of the gate electrode but not on the nitride layer;
    g) removing the nitride layer;
    h) forming a conformal oxide layer over the cap insulator and the thin oxide layer;
    i) removing the conformal oxide layer and the thin oxide layer until the surface of the epitxial layer is exposed;
    j) implanting second semiconductor type dopants into an upper portion of the epitaxial to form a body layer of a second semiconductor type;
    k) forming a polysilicon layer of the first semiconductor type over the cap insulator and an exposed surface of the body layer;

l) anisotropically etching away the from a top of the cap insulator and surface of the body layer leaving a spacer on a sidewall of the cap insulator;

m) diffusing at least a portion of the first semiconductor type dopants from the spacer into the body layer to form a top source region proximate the spacer wherein the source is of a first semiconductor type; and n) doping a portion of the body layer proximate the spacer with second semiconductor type dopants to form a body contact region within the body region.

13. A method for manufacturing a vertical semiconductor device comprising:

a) forming a trench in an epitaxial layer through an opening in a hardmask layer, wherein the epitaxial layer is of a first semiconductor type;

b) lining a bottom and one or more sidewalls of the trench with a gate insulating layer;

c) filling the trench and opening in the hardmask with doped to form a gate electrode, wherein a gate oxide is disposed between the gate electrode and the epitaxial layer;

d) etching the in the trench to a level below an upper surface of the mask layer to form a gate electrode;

e) filling a space between a top of the gate electrode and the upper surface of the mask with an insulating material to form a cap insulator over one or more portions of the gate electrode that are not covered by the gate oxide;

f) removing the mask layer leaving the cap insulator and a portion of the gate electrode protruding above a surface of the epitaxial layer;

g) implanting second semiconductor type dopants into an upper portion of the epitaxial to form a body layer of a second semiconductor type;

h) forming an oxide layer on a sidewall of the gate electrode and an exposed surface of the body layer but not on the cap insulator;

i) anisotropically etching the oxide layer down to the surface of the P-body layer using the cap insulator as a mask to leave portions of the oxide layer on the sidewall of the gate electrode;

j) forming a highly doped layer of the first semiconductor type over the cap insulator and an exposed surface of the body layer;

k) anisotropically etching away the highly doped layer from a top of the cap insulator and surface of the body layer leaving a spacer of a first semiconductor type next to the sidewall of the gate electrode and the nitride cap;

l) etching back portions of the body layer not covered by the spacer such that a step portion of body layer protrudes above a surface of a remaining portion of the body layer;

m) diffusing at least a portion of the first semiconductor type dopants from the spacer into the step portion of the body layer to form a source region of the first semiconductor type proximate the spacer; and n) doping a portion of the body layer proximate the source region with second semiconductor type dopants using the spacer as a mask to form a body contact region within the body region.

* * * * *